US011393355B1

(12) United States Patent
Warren et al.

(10) Patent No.: US 11,393,355 B1
(45) Date of Patent: Jul. 19, 2022

(54) SYSTEM FOR FLIGHT SIMULATION OF AN ELECTRIC AIRCRAFT

(71) Applicant: BETA AIR, LLC, South Burlington, VT (US)

(72) Inventors: Nicholas Granger Warren, Burlington, VT (US); Charles C. Guthrie, Burlington, VT (US); Nicholas Moy, Burlington, VT (US); Alexander Hoekje List, South Burlington, VT (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

(21) Appl. No.: 17/373,889

(22) Filed: Jul. 13, 2021

(51) Int. Cl.
| | |
|---|---|
| *G09B 9/08* | (2006.01) |
| *G06F 30/20* | (2020.01) |
| *G09B 9/16* | (2006.01) |
| G09B 9/24 | (2006.01) |
| G09B 9/30 | (2006.01) |

(52) U.S. Cl.
CPC ............. *G09B 9/085* (2013.01); *G06F 30/20* (2020.01); *G09B 9/165* (2013.01); G09B 9/24 (2013.01); G09B 9/301 (2013.01); G09B 9/307 (2013.01)

(58) Field of Classification Search
CPC ... G09B 9/00; G09B 9/02; G09B 9/08; G09B 9/085; G09B 9/16; G09B 9/165; G09B 9/24; G09B 9/30; G09B 9/301; G09B 9/307; G06F 30/20; G05D 2201/02; G05D 2201/0207; G05D 2201/0209
See application file for complete search history.

(56) References Cited

U.S. PATENT DOCUMENTS

2010/0318336 A1\* 12/2010 Falangas ................. G06F 30/15 703/8
2011/0039235 A1\* 2/2011 Margreiter ............... A63G 1/10 434/35

(Continued)

FOREIGN PATENT DOCUMENTS

CN 107438799 B 3/2019

OTHER PUBLICATIONS

Lemmens, Y., Benoit, T., DE Roo, R., and Verbeke, J., Real-time Simulation of an Integrated Electrical System of a UAV, Dec. 31, 2014.

(Continued)

*Primary Examiner* — Timothy A Musselman
(74) *Attorney, Agent, or Firm* — Caldwell Intellectual Property Law, LLC

(57) ABSTRACT

A system for flight simulation of an electric aircraft. The system includes a pilot control. The pilot control is configured to receive an input from a user. The system includes a pilot command that is generated by the pilot control. The system includes a computing device configured to generate a simulation. The simulation includes an electric aircraft model. The electric aircraft model is configured to simulate a performance of an electric aircraft. The performance is determined by at least the pilot command. The simulation is configured to provide feedback to the user based on the performance of the electric aircraft. The simulation is further configured to updated the electric aircraft model as a function of the pilot command.

20 Claims, 9 Drawing Sheets

(56) References Cited

U.S. PATENT DOCUMENTS

| | | | |
|---|---|---|---|
| 2016/0091894 A1* | 3/2016 | Zhang | G05D 1/0044 |
| | | | 701/2 |
| 2016/0307447 A1 | 10/2016 | Johnson et al. | |
| 2019/0088157 A1 | 3/2019 | Zhang et al. | |
| 2020/0192989 A1* | 6/2020 | Ponda | G05B 17/02 |
| 2020/0346769 A1 | 11/2020 | Knapp et al. | |
| 2021/0125515 A1* | 4/2021 | Mikic | G09B 9/10 |

OTHER PUBLICATIONS

Vittorio Cipolla, Fabrizio Oliviero, HyPSim: a simulation tool for hybrid aircraft performance analysis, Dec. 30, 2016.
AeroSIM RC, AeroSIM-RC—Wiki, Dec. 31, 2021.
Brian Bole, Christopher Teubert, Quach Cuong Chi, Hogge Edward, Sixto Vazquez, Kai Goebel, Vachtsevanos George, SIL/HIL Replication of Electric Aircraft Powertrain Dynamics and Inner-Loop Control for V&V of System Health Management Routines, Dec. 31, 2013.
Calvin Coopmans, Michal Podhradsky, Nathan V. Hoffer, Software- and Hardware-in-the-Loop Verification of Flight Dynamics Model and Flight Control Simulation of a Fixed-Wing Unmanned Aerial Vehicle, Nov. 30, 2015.
Jonathan Harrison; Devin Charles; Jon Zenker; Evan Frank, Using Multi-physics System Simulation to Predict Battery Pack Thermal Performance and Risk of Thermal Runaway During eVTOL Aircraft Operations, Dec. 26, 2019.

* cited by examiner

SYSTEM FOR FLIGHT SIMULATION OF AN ELECTRIC AIRCRAFT

GOVERNMENT LICENSE RIGHTS

This invention was made with Government support under FA86492000106 awarded by the Air Force Research Laboratory. The Government has certain rights in the invention.

FIELD OF THE INVENTION

The present invention generally relates to the field of flight simulation and training systems. In particular, the present invention is directed to a system and method for flight simulation of an electric aircraft.

BACKGROUND

In electric aircrafts (e.g. electric vertical take-off and landing (eVTOL) aircrafts), training of a pilot can be challenging due to the complexity of certification and/or license requirements. Integration between the pilot training course content, flight simulator, and electric aircraft can be highly complex due to the unique needs to achieve the ability to pilot an eVTOL aircraft.

SUMMARY OF THE DISCLOSURE

In an aspect, a system for flight simulation of an electric aircraft includes a pilot control. The pilot control is configured to receive an input from a user. The system includes a pilot command that is generated by the pilot control. The system includes a computing device configured to generate a simulation. The simulation includes an electric aircraft model. The electric aircraft model is configured to simulate a performance of an electric aircraft. The performance is determined by at least the pilot command. The simulation is configured to provide feedback to the user based on the performance of the electric aircraft. The simulation is further configured to updated the electric aircraft model as a function of the pilot command.

In another aspect, a method for simulating a flight of an electric aircraft is presented. The method includes providing a pilot controller configured to receive an input from a user. The method includes receiving on a computing device a pilot command. The pilot command is generated by a user input from a pilot control. The method includes generating on the computing device a simulation. The simulation is configured to include an electric aircraft model. The electric aircraft model is configured to simulate a performance of an electric aircraft. The performance is determined by at least the pilot command. The electric aircraft model is configured to provide feedback to the user based on the performance of the electric aircraft. The simulation includes a performance metric of the electric aircraft model. The method includes updating the simulation as a function of the pilot command.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

Figure 1:
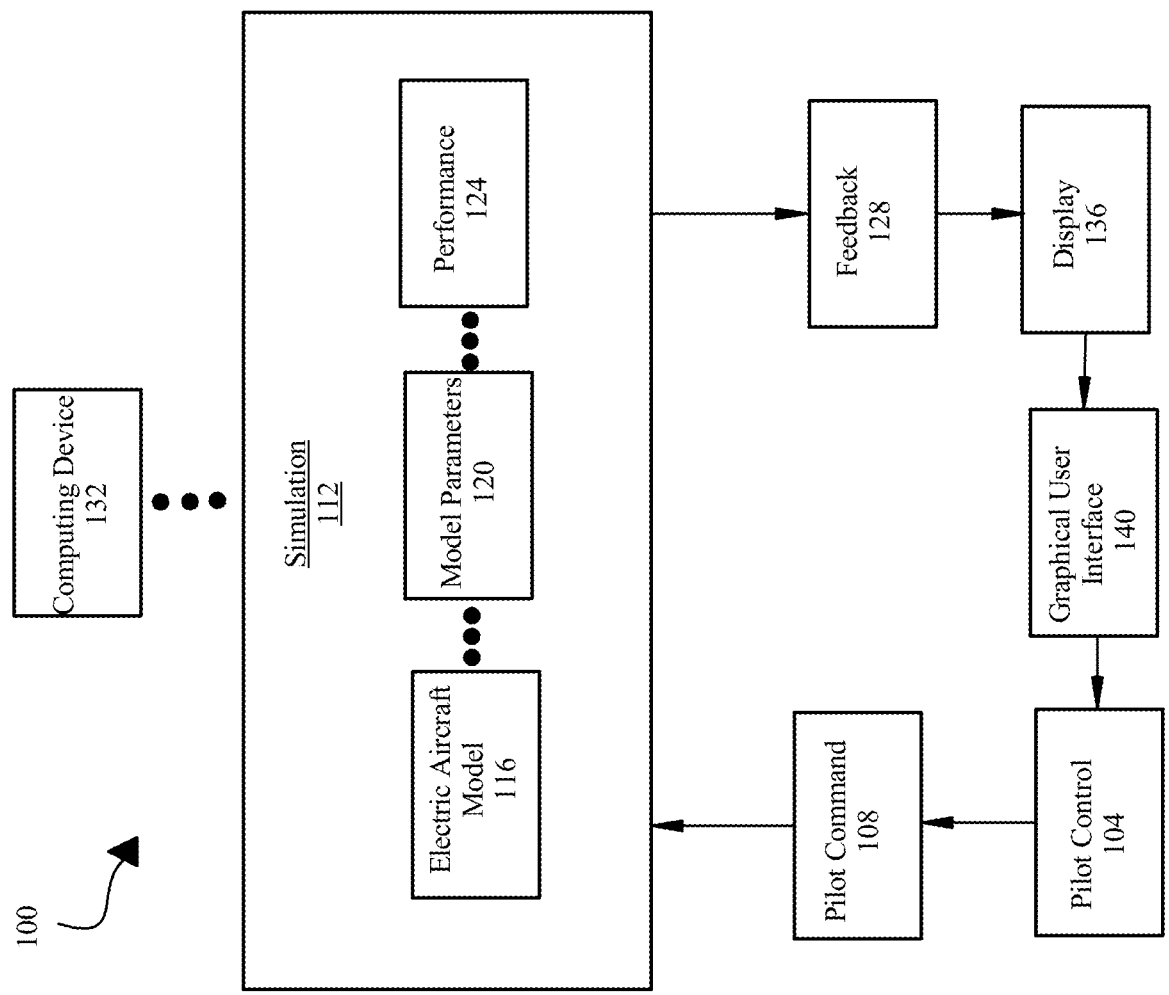
FIG. 1 is a block diagram illustrating an exemplary embodiment of a system for flight simulation of an electric aircraft.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply embodiments of the inventive concepts defined in the appended claims. Hence, specific dimensions and other physical characteristics relating to the embodiments disclosed herein are not to be considered as limiting, unless the claims expressly state otherwise.

Described herein is a system for flight simulation of an electric aircraft. In some embodiments, the system includes a pilot control. A pilot control may be configured to receive an input from a user. In some embodiments, a pilot control may include a control device. A pilot control may include a brake device. A pilot control may include a throttle device. In some embodiments, the system includes a pilot command. A pilot command may be generated by the input of the pilot control. In some embodiments, a pilot command may be configured to identify a torque of a flight component of an electric aircraft model as a function of the input of the user. In some embodiments, the system include a computing device. A computing device may be configured to generate a simulation. A simulation may include an electric aircraft model. An electric aircraft model may be configured to simulate a performance of an electric aircraft. In some embodiments, an electric aircraft model may include an eVTOL. A performance may be determined by at least a pilot command. In some embodiments, a simulation may be configured to provide feedback to a user based on a performance of an electric aircraft. A performance may include a battery performance of an electric aircraft model. In some embodiments, a battery performance may include a thermal performance of a battery of an electric aircraft mode. In some embodiments, a battery performance may include a charge state. In some embodiments, a battery performance may include a health state. In some embodiments, a performance may include a health state. A simulation may be configured to update an electric aircraft model as a function of a pilot command.

Described herein is a method for simulating a flight of an electric aircraft. In some embodiments, the method may include providing a pilot controller. A pilot controller may include a control device. A pilot controller may include a braking device. A pilot controller may include a throttle device. A pilot controller may be configured to receive an input from a user. The method may include receiving a pilot command on a computing device. A pilot command may be generated by a user input from a pilot control. A pilot command may be configured to identify a torque applied to a flight component of the electric aircraft model based on the user input of the flight controller. In some embodiments, the method includes generating a simulation on a computing device. A simulation may be configured to include an electric aircraft model. In some embodiments, an electric aircraft model may include an eVTOL. In some embodiments, an electric aircraft model may be configured to simulate a performance of an electric aircraft. A performance may be determined by at least a pilot command. An electric aircraft model may be configured to provide feedback to the user based on the performance of an electric aircraft. The simulation may include a performance metric of the electric aircraft model. A performance metric may include a battery performance of an electric aircraft model. A battery performance may include a thermal performance. A battery performance may include a charge state. The method may include updating a simulation as a function of the pilot command. In some embodiments, a simulation may be further configured to include a graphical user interface (GUI).

Referring now to the drawings, FIG. 1 illustrates an exemplary embodiment of a block diagram for a flight simulation system 100 of an electric aircraft. In some embodiments, system 100 may include a pilot control 104. Pilot control 104 may be configured to receive an input from a user. In some embodiments, pilot control 104 may include a control device. A control device may be configured to simulate a control device of an electric aircraft. In some embodiments, a control device may include a control device used in a real electric aircraft that is configured to operate in the simulated environment of flight simulation system 100. A control device may include, but is not limited to, a wheel, a control stick, and/or a throttle lever. In some embodiments, pilot control 104 may include a braking device. A braking device may be configured to simulate a braking device used in an electric aircraft. A braking device may include, but is not limited to, a pedal, a lever, a throttle, and/or a pulley. In some embodiments, pilot control 104 may include a throttle device. The throttle device may be configured to simulate a throttle device used in an electric aircraft. In some embodiments, the throttle device may include, but is not limited to, a lever, a pedal, and/or a shaft. Examples of a control device include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, an inceptor stick, and any combinations thereof. Pilot control 104 may receive input from a user through standard I/O interface such as ISA (Industry Standard Architecture), PCI (Peripheral Component Interconnect) Bus, and the like. Pilot control 104 may receive input from user through standard I/O operation. In one embodiment, pilot control 104 may further receive input from a user through optical tracking of motion. In one embodiment, pilot control 104 may further receive input from a user through voice-commands. Pilot control 104 may further use event-driven programming, where event listeners are used to detect input from user and trigger actions based on the input. In some embodiments, pilot control 104 may include an inceptor stick. Inceptor stick may be consistent with disclosure of inceptor stick in U.S. patent application Ser. No. 17/001,845 and titled "A HOVER AND THRUST CONTROL ASSEMBLY FOR DUAL-MODE AIRCRAFT", which is incorporated herein by reference in its entirety.

In some embodiments, and with continued reference to FIG. 1, pilot control 104 may include other devices used to simulate operating an electric aircraft. Pilot control 104 may include a graphical user interface (GUI) 140 displayed on one or more screens. As an example, and without limitation, GUI 140 may be displayed on any electronic device, as described herein, such as, without limitation, a computer, tablet, remote device, and/or any other visual display device. Display 136 may be configured to present, to a user, information related to the flight plan. Display 136 may include a graphical user interface, multi-function display (MFD), primary display, gauges, graphs, audio cues, visual cues, information on a heads-up display (HUD) or a combination thereof. The display may include a display disposed in one or more areas of an aircraft, on a user device remotely located, one or more computing devices, or a combination thereof. Display 136 may be disposed in a projection, hologram, or screen within a user's helmet, eyeglasses, contact lens, or a combination thereof. Display 136 may further include at least a peripheral display. The peripheral display may further be mounted to a pilot's head that is in the peripheral of the user's field of view. In some embodiments, display 136 may be configured to display at least a graphical element of simulation 112. In some embodiments, display 136 may include a plurality of displays and may be configured to display imagery that is immersive to a user. For example, in some cases, display 136 may include a curved screen or set of screens that cover a field of vision. In some embodiments, display 136 may be configured to display a field of vision extending peripherally to cover some or all of the field of vision possible from a cockpit of an aircraft. In some cases, display 136 may include an Omnimax or Imax screen. In some cases, display 136 may include a projector, for example red, green, blue, (RGB) projectors and the like. In some cases, display 136 may include multiple screens, which may be joined together to form a larger screen with various possible geometric configurations. In some cases, display 136 may include multiple projectors. In some cases, display 136 may include circuitry, hardware, firmware, and/or software to coordinate image display using multiple screens/projectors. For example, circuitry, hardware, firmware, and/or software may be configured to overlap display zones or views from multiple displays, screens, projectors, and the like.

With continued reference to FIG. 1, in some cases, display 136 may include a stereoscopic display. A "stereoscopic display" as used in this disclosure, is a display 136 that simulates a user experience of viewing a three-dimensional space and/or object, for instance by simulating and/or replicating different perspectives of a user's two eyes; this is in contrast to a two-dimensional image, in which images presented to each eye are substantially identical, such as may occur when viewing a flat screen display. Stereoscopic display 136 may display two flat images having different perspectives, each to only one eye (i.e., parallax), which may simulate the appearance of an object or space as seen from the perspective of that eye. Alternatively or additionally, stereoscopic display 136 may include a three-dimensional display 136 such as a holographic display 136 or the like. In some embodiments, display 136 may include an autostereoscopic display. In some cases, an autostereoscopic display may include a single screen that projects two or more views, which are relayed to different eyes of a viewer, for example without limitation by way of lenticular lenses. In some cases, an autostereoscopic display may include adaptive optics elements, such as adaptive lenticular lenses using indium tin oxide electrodes and a liquid crystal cell, to adjust optical properties of the lenticular lens according to a sensed position of a user's eyes. In some cases, an eye-tracking system, for example a system including an eye-tracking camera, may be used to determine a location of a user's eyes (e.g., pupils) relative a display 136 and adjust adaptive optics and display parameters accordingly. In some cases, an autostereoscopic display may project multiple views for multiple pairs of eyes, such that different views are viewable from different locations relative display 136. In some exemplary cases, an autostereoscopic display having a static lenticular lens screen may project 7 different views. Persons skilled in the art, upon reviewing the entirety of this disclosure, will be aware of various alternative or additional types of stereoscopic display 136 that may be employed in system 100. In some cases, display 136 may include a display usable with a headset, for example an augmented reality or virtual reality headset. For example, in some cases, display 136 may include a liquid crystal display and/or a heads-up display. Headset may include a screen that displays a field of vision to user. System 100 may include a projection device, defined as a device that inserts images into field of vision. Projection device may include a software and/or hardware component that adds inserted images into a display 148 signal to be rendered on the display 136. Projection device and/or display may make use of reflective waveguides, diffractive waveguides, or the like to transmit, project, and/or display images. For instance, and without limitation, projection device and/or display 136 may project images through and/or reflect images off an eyeglass-like structure and/or lens piece, where either both field of vision and images from projection device may be so displayed, or the former may be permitted to pass through a transparent surface. Projection device and/or display 136 may be incorporated in a contact lens or eye tap device, which may introduce images into light entering an eye to cause display of such images. Projection device and/or display 136 may display some images using a virtual retina display (VRD), which may display an image directly on a retina of user.

In some embodiments and still referring to FIG. 1, GUI 140 may be configured to display a simulated cockpit of an electric aircraft. In other embodiments, GUI 140 may be configured to display visual indicators that may be used with real electric aircraft, such as but not limited to, altitude, wind speed, aircraft speed, roll, yaw, pitch, flight component status, torque of a flight component, temperature of a battery, power output of a battery, remaining battery charge, battery health, and/or fuel supply. GUI 140 may display a flight plan in graphical form. Graphical form may include a two-dimensional plot of two variables that represent data received by the controller, such as past maneuvers and predicted future maneuvers. In one embodiment, GUI 140 may also display a user's input in real-time. GUI 140 may be configured to show a primary flight display. The primary flight display may include an airspeed indicator, altitude indicator, slip skid indicator, altimeter, vertical speed indicator (VSI), turn indicator, horizontal situation indicator, and/or a turn rate indicator. In some embodiments, the primary flight display may include a general cruising speed, a ground airspeed, a flap range, a best angle of climb speed, a rotation speed and/or a best rate of climb speed. The primary flight display may include a transponder code, air temperature, waypoint, distance to waypoint, time and/or compass. In some embodiments, GUI 140 may display a maneuver that was just performed by a user, a suggested maneuver to be performed, and a maneuver being currently performed by the user. In some embodiments, GUI 140 may display a different suggested maneuver upon deviation by the user from flight plan. In a nonlimiting example, GUI may display different color schemes for immediate past maneuver, suggested immediate future maneuver, and a maneuver being currently performed. In one embodiment, additionally to the flight plan, GUI 140 may display an objective and a directional line once objective is nearby. In one embodiment, GUI 140 may display a directional path to the objective when the flight plan is set for an intermediate objective. In a nonlimiting example, GUI 140 may display a dotted path additionally to the suggested maneuvers and a graphical representation of the objective one user gets near the objective as to assist user when landing or reaching objective. In another nonlimiting example, GUI 140 may display a dotted line connected to the final objective as to keep user informed of direction of final objective when flight plan is set for an intermediate objective.

In some embodiments, GUI 140 may display a warning symbol to a user. The warning symbol may include an abbreviation, a sign, or combination thereof. The warning symbol may highlight itself in blinking form, different colors, or combination thereof. Examples of warning symbols may indicate, but not limited to, a malfunction or failure of at least a flight component, flight controller, unfavorable landing location, and the like. The warning symbol or plurality of warning symbols may dissuade the pilot from undertaking a disadvantageous action. Examples of disadvantageous actions include, but not limited to, at least actions that may harm the VTOL aircraft or flight components, actions that may hard the pilot, actions that may produce collateral damage, and the like.

Pilot controller 104 may be configured to transform an input of a user into a pilot command 108. Pilot command 108 may include a desired torque applied to one or more propulsors based on a user input. Pilot command 108 may include data about torque, power, direction, acceleration and/or deceleration.

With continued reference to FIG. 1, pilot command 108 may be configured to be sent to computing device 132. Computing device 132 may be configured to generate a simulation 112. For example, and without limitation, computing device 132 may include one or more devices capable of modeling, simulating, analyzing, and the like thereof a multidomain system. Computing device 132 may be configured to generate an electric aircraft model 116. As used in this disclosure a "model" is a representation and/or graphical image denoting an artificial and/or virtual aircraft in flight. In an embodiment, and without limitation, electric aircraft model 116 may denote an environment in which the artificial and/or virtual aircraft flies. In some cases, electric aircraft model 116 may include one or more physics models, which represent analytically or through data-based, such as without limitation machine-learning processes, one or more physical phenomena. One or more physical phenomena may be associated with an aircraft and/or an environment. For example, some versions of electric aircraft model 116 may include thermal models representing aircraft components by way of thermal modeling. Thermal modeling techniques may, in some cases, include analytical representation of one or more of convective hear transfer (for example by way of Newton's Law of Cooling), conductive heat transfer (for example by way of Fourier conduction), radiative heat transfer, and/or advective heat transfer. In some cases, electric aircraft model 116 may include models representing fluid dynamics. For example, in some embodiments, simulation 112 may include a representation of turbulence, wind shear, air density, cloud, precipitation, and the like. In some embodiments, electric aircraft model 116 may include at least a model representing optical phenomenon. For example, simulation 112 may include optical models representative of transmission, reflectance, occlusion, absorption, attenuation, and scatter. Electric aircraft model 116 may include non-analytical modeling methods; for example, simulation 112 may include, without limitation, a Monte Carlo model for simulating optical scatter within a turbid medium, for example clouds. In some embodiments, electric aircraft model 116 may represent Newtonian physics, for example motion, pressures, forces, moments, and the like. Simulation 112 may include Microsoft Flight Simulator from Microsoft of Redmond, Wash., U.S.A. Additionally or alternatively, electric aircraft model 116 may include one or more aerodynamics models, inertial models, mass models, propeller models, pusher motor models, Euler models, sensor models, battery models, and the like thereof. In an embodiment, and without limitation, sensor models may denote one or more representations of injecting noise, failed sensors, white noise potential, transfer functions, and the like thereof. In another embodiment, battery models may denote one or more estimation algorithms, power capabilities, thermal outputs, power capabilities, and the like thereof. In another embodiment, electric aircraft model 116 may include a simple path and/or a variant path. As used in this disclosure a "simple path" is a less complex algorithm that allows for a faster simulation. In an embodiment, and without limitation, simple path may denote a fast simulation, wherein the enhanced speed reduces the accuracy of electric aircraft model 116. As used in this disclosure a "variant path" is a more complex algorithm that allows for a slower simulation. In an embodiment, and without limitation, variant path may denote a slow simulation, wherein the reduced speed enhances the accuracy of electric aircraft model 116.

Still referring to FIG. 1, simulation 112 may be configured to generate an electric aircraft model 116. In some embodiments, simulation 112 may be configured to generate a flight component of an electric aircraft. A "model," as used in this disclosure, is a data structure and/or program that can simulate one or more relevant aspects of an object or device such as a flight component; one or more relevant aspects may include one or more behaviors affecting a designed use of the flight component to aid in flying and/or navigation of an aircraft. As used in this disclosure a "flight component" is a portion of an aircraft that can be moved or adjusted to affect one or more flight elements. For example, a flight component may include a component used to affect the aircrafts' roll and pitch which may comprise one or more ailerons. As a further example, a flight component may include a rudder to control yaw of an aircraft. In some embodiments, electric aircraft model 116 may include a propulsor model. The propulsor model may include a set of data corresponding to a virtual propulsor's torque output. The propulsor model may include a computer program or computer application that represents propulsor torque performance given a certain set of conditions. This set of conditions may include a performance parameter. The performance parameters may include environmental parameters such as air density, air speed, true airspeed, relative airspeed, temperature, humidity level, and weather conditions, among others. The performance parameter may include propulsor parameters that define a propulsors physical characteristics and/or specifications such as material properties, electrical characteristics, propulsor type, weight, geometry, speed, and revolutions per minute (rpm), among others. The performance parameter may include velocity and/or speed in a plurality of ranges and direction such as vertical speed, horizontal speed, changes in angle or rates of change in angles like pitch rate, roll rate, yaw rate, or a combination thereof, among others.

In some embodiments, electric aircraft model 116 may be configured to generate a model torque datum including a model torque datum threshold. A "model torque datum", for the purposes of this disclosure, is an element of data that represents an ideal torque output form an ideal propulsor model. One of ordinary skill in the art, after reviewing the entirety of this disclosure, would appreciate that model torque datum is the torque output an ideal virtual torque data from a perfect propulsor given performance parameter of a plurality of performance parameters. For example, in a nonlimiting embodiment, the propulsor model may include a performance parameter including air density, propulsor type, electrical input, and rpm. The model torque datum may be generated by to represent what a perfect (ideal) propulsor would output as torque given the performance parameters. The model torque datum threshold may include a range of acceptable torque values associated with the model torque datum. The model torque datum threshold may include a minimum and maximum torque value associated with the model torque datum. Simulation 112 may be configured to detect if the output torque datum is outside the model torque datum threshold, which may then trigger detection of datums consistent with this disclosure. In some embodiments, electric aircraft model 116 may be configured to generate models of aircrafts and flight components as described in U.S. patent application Ser. No. 17,348,916 filed Jun. 16, 2021, titled "METHODS AND SYSTEMS FOR SIMULATED OPERATION OF AN ELECTRIC VERTICAL TAKE-OFF AND LANDING (EVTOL) AIRCRAFT", of which is incorporated by reference herein in its entirety.

With continued reference to FIG. 1, electric aircraft model may be configured to include a torque percentage datum. A "torque percentage datum", for the purposes of this disclosure, is an element of data representing the actual torque produced by at least a propulsor compared to the modeled torque output of the same ideal propulsor given the same performance parameters. For example, in a nonlimiting embodiment, electric aircraft model 116 may generate a torque percentage datum by dividing an output torque datum by the model torque datum. The torque percentage datum may represent the torque output of an actual propulsor versus the same propulsor in an ideal world, giving way to a percentage of ideal torque. The torque percentage datum may be represented as a fraction, percentage, decimal, or other mathematical representation of part of a whole. One of ordinary skill in the art, after reviewing the entirety of this disclosure would appreciate that there are virtually limitless visual, auditory, haptic or other types of representations that the torque percentage datum may take.

In some embodiments and still referring to FIG. 1, electric aircraft model 116 may include a battery model. The battery model may include any model related to at least property, characteristic, or function of a battery located within aircraft. In some cases, the battery model may include a model of a battery controller, management, and/or monitoring system. Disclosure related to battery management for eVTOL aircraft may be found in patent application Ser. Nos. 17/108, 798 and 17/111,002, entitled "PACK LEVEL BATTERY MANAGEMENT SYSTEM" and "ELECTRICAL DISTRIBUTION MONITORING SYSTEM FOR AN ELECTRIC AIRCRAFT," respectively, each of which is incorporated herein by reference in its entirety. In some cases, a battery model may include an electrochemical model of battery, which may be predictive of energy efficiencies and heat generation and transfer of at least a battery. In some cases, a battery model may be configured to predict battery lifetime, given known battery parameters, for example measured battery performance, temperature, utilization, and the like.

Still referring to FIG. 1, electric aircraft model 116 may be configured to produce a simulation of at least a flight element of an electric aircraft. As used in this disclosure a "simulation" is an imitation of aircraft and/or flight of an aircraft. For example, and without limitation, simulation may denote at least a flight element of an electric aircraft, wherein a flight element is an element of datum denoting a relative status of aircraft. In an embodiment, and without limitation, a flight element may denote one or more torques, thrusts, airspeed velocities, forces, altitudes, groundspeed velocities, directions during flight, directions facing, forces, orientations, and the like thereof. In an embodiment, and without limitation, electric aircraft model 116 may produce a simulation denoting one or more adjustments to an altitude as a function of an adjusted and/or shifted direction during flight. As a further non-limiting example, electric aircraft model 116 may produce a simulation denoting one or more modifications to an airspeed velocity as a function of a changing and/or altered windspeed velocity. In an embodiment, and without limitation, electric aircraft model 116 may be configured to include operational data of a flight component for a plurality of simulated conditions. As used in this disclosure "operational data" is information denoting one or more operational functions of a flight component. For example, and without limitation, operational data may denote one or more rotational speeds, torques, forces, rpms, and the like thereof. For example, and without limitation, operational data may denote that a propulsor is rotating at a speed of 800 rpms. As a further non-limiting example, operational data may denote that an aileron is angled at 3.3° upward. In an embodiment, and without limitation, operational data may denote one or more voltage levels, electromotive force, current levels, temperature, current speed of rotation, and the like thereof. In another embodiment, operational data may denote one or more electrical parameters of a flight component such as a voltage, current, and/or ohmic resistance of a flight component. As used in this disclosure a "simulated condition" is a condition and/or environment that is to be simulated for flight condition. For example, and without limitation, simulated conditions may include an environmental condition of a wind force and/or precipitation. As a further non-limiting example, simulated conditions may include one or more alterations and/or modifications of operational datum. Simulation 112 may include algorithms and/or machine learning models, systems, and any combination thereof found in the flight controller as described with reference to FIG. 7 below. In some embodiments, electric aircraft model 116 may include electric aircraft components and structures as described in further detail with reference to FIG. 2 below.

Computing device 112 may be configured to simulate an operation of an electric aircraft. The operation may include any step in a flight sequence. In some embodiments, the operation may include an initialization operation for preparing a flight of an electric aircraft. In some embodiments, the operation may include a takeoff operation. The takeoff operation may include procedures and steps that my correlate to an initial transition from a resting position to a hovering position. In some embodiments, the operation may include a cruising operation. The cruising operation may include procedures and that may correlate to transitioning an electric aircraft from a takeoff position to a cruising position. In some embodiments, the operation may include a landing operation. The landing operation may include procedures and steps that may correlate with landing an electric aircraft. In some embodiments, computing device 132 may be configured to simulate a virtual reality. In some embodiments, computing device 132 may be configured to simulate an augmented reality. In some embodiments, computing device 132 may be configured to simulate an electric aircraft model 116. Electric aircraft model 116 may include an eVTOL. Electric aircraft model 116 may be configured to include a power system. The power system may include an electrical system that may include a battery pack. In some embodiments, electric aircraft model 116 may include a flight system. The flight system may include one or more propulsors. The one or more propulsors may include vertical and horizontal propulsors. In some embodiments, the electric aircraft model 116 may be configured to simulate a weight and dimension of a real electric aircraft. Electric aircraft model 116 may be configured to include a set of aerodynamics. The set of aerodynamics may include data about lift, thrust, air resistance, and other aerodynamic parameters. In some embodiments, electric aircraft model 116 may be configured to include a plurality of battery packs, battery cells, and/or battery assemblies. Computing device 132 may be configured to generate model parameters 120. Model parameters 120 may include a plurality of parameters that may be applied to electric aircraft model 116. Model parameters 120 may include, but are not limited to, weather, altitude, location, wind speed, aircraft weight, aircraft dimensions, fuel supply, aircraft health, propulsion systems, power systems, cargo status, and/or other parameters, alone or in combination. Computing device 132 may be configured to apply model parameters 120 to electric aircraft model 116. In some embodiments, model parameters 120 may be configured to simulate a plurality of flight scenarios. The flight scenarios may be configured to correspond to a plurality of training courses for a user. In some embodiments, model parameters 120 may include a battery health and a battery charge status of electric aircraft model 116. The battery health and batter charge status may include data about battery temperature, battery capacity, battery voltage, battery current, battery integrity, and/or a battery failure. In some embodiments, electric aircraft model 116 may include thermal models for one or more propulsors of a propulsion system. In some embodiments, electric aircraft model 116 may include a high voltage simulation. In some embodiments, electric aircraft 116 may include a low voltage simulation.

Continuing to refer to FIG. 1, in some embodiments, computing device 132 may be configured to determine a performance 124 of electric aircraft model 116. A "performance" as defined in this disclosure is the difference of an action relative to a desired goal or outcome of the action. Performance 124 may be determined from a plurality of factors. Performance 124 may be determined based on pilot command 108. In some embodiments, performance 124 may be determined relative to model parameters 120. In some embodiments, performance 124 may be determined based on a set of goals of a training course included in model parameters 120. Performance 124 may include information about electric aircraft model 116, such as health and fuel supply. In some embodiments performance 124 may be determined based on a time score. In some embodiments, performance 124 may be determined based on a flight path taken. In some embodiments, performance 124 may be determined based on a deviation from a desired flight path. In some embodiments, performance 124 may be determined based on fuel efficiency. In some embodiments, performance 124 may be determined based on a landing of electric aircraft model 116. The landing may be scored based on a plurality of metrics. The landing may be scored based on descent speed. The landing may be scored based on landing accuracy in a landing zone. The landing may be scored based on power efficiency. In some embodiments, computing device 132 may be configured to transform performance 124 into a feedback 128. Feedback 128 may be configured to relay performance 124 data to a user. In some embodiments, feedback 128 may include a user score. In some embodiments, the user score may be determined by a plurality of factors. In some embodiments, feedback 128 may include a breakdown of areas of improvement based on performance 124. The areas of improvement may include power efficiency, flight path deviation, electric aircraft health and/or other metrics. In some embodiments, feedback 128 may be configured to be displayed on a GUI of pilot control 104. In some embodiments, feedback 128 may be a real time feedback shown in pilot control 104. In some embodiments, feedback 128 may include suggestions for flight maneuvers. In some embodiments, feedback 128 may include an average score from a history of simulated flights. In some embodiments, feedback 128 may be shown relative to performance of other users. In some embodiments, feedback 128 may be shown relative to a goal of a training course. In some embodiments, feedback 128 may be configured to display a battery performance metric. The battery performance metric may include, but is not limited to, battery charge, battery health, battery temperature, and/or battery usage. In some embodiments, feedback 128 may be configured to suggest a better flight maneuver and/or path to preserve the battery of electric aircraft model 116. In some embodiments, feedback 128 may be configured to take control of pilot control 104 to illustrate a better way of piloting an electric aircraft for a user. In some embodiments, feedback 128 may be an auditory stimulus. In some embodiments, the auditory stimulus may include alerts. The alerts may include, but are not limited to, altitude alerts, battery alerts, temperature alerts, speed alerts, propulsion system alerts, collision alerts, or other alerts, alone or in combination. In some embodiments, computing device 132 may be configured to send performance 124 and feedback 128 to an external computing device. In some embodiments, computing device 132 may retain a history of performance 124 for a plurality of users in a database.

Figure 2:
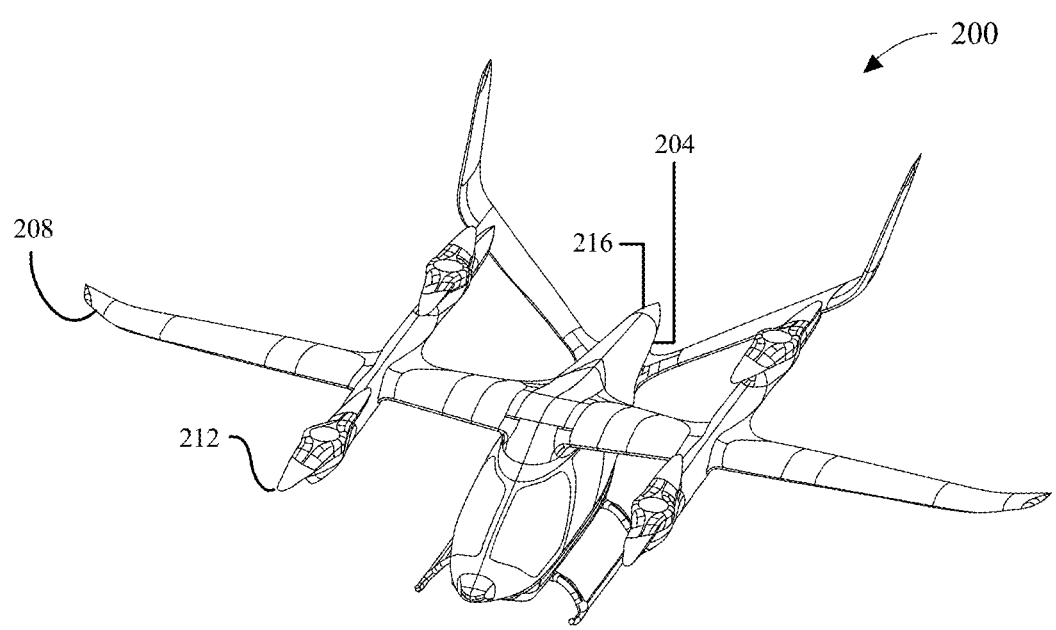
FIG. 2 is an exemplary embodiment of an eVTOL.

Now referring to FIG. 2, an exemplary embodiment of an eVTOL 200 is illustrated. eVTOL 200 may include a fuselage 204. As used in this disclosure a "fuselage" is the main body of an aircraft, or in other words, the entirety of the aircraft except for the cockpit, nose, wings, empennage, nacelles, any and all control surfaces, and generally contains an aircraft's payload. Fuselage 204 may comprise structural elements that physically support the shape and structure of an aircraft. Structural elements may take a plurality of forms, alone or in combination with other types. Structural elements may vary depending on the construction type of aircraft and specifically, the fuselage. Fuselage 204 may comprise a truss structure. A truss structure is often used with a lightweight aircraft and comprises welded steel tube trusses. A truss, as used herein, is an assembly of beams that create a rigid structure, often in combinations of triangles to create three-dimensional shapes. A truss structure may alternatively comprise wood construction in place of steel tubes, or a combination thereof. In embodiments, structural elements may comprise steel tubes and/or wood beams. In an embodiment, and without limitation, structural elements may include an aircraft skin. Aircraft skin may be layered over the body shape constructed by trusses. Aircraft skin may comprise a plurality of materials such as plywood sheets, aluminum, fiberglass, and/or carbon fiber, the latter of which will be addressed in greater detail later in this paper.

In embodiments, fuselage 204 may comprise geodesic construction. Geodesic structural elements may include stringers wound about formers (which may be alternatively called station frames) in opposing spiral directions. A stringer, as used herein, is a general structural element that comprises a long, thin, and rigid strip of metal or wood that is mechanically coupled to and spans the distance from, station frame to station frame to create an internal skeleton on which to mechanically couple aircraft skin. A former (or station frame) can include a rigid structural element that is disposed along the length of the interior of fuselage 204 orthogonal to the longitudinal (nose to tail) axis of the aircraft and forms the general shape of fuselage 204. A former may comprise differing cross-sectional shapes at differing locations along fuselage 204, as the former is the structural element that informs the overall shape of a fuselage 204 curvature. In embodiments, aircraft skin can be anchored to formers and strings such that the outer mold line of the volume encapsulated by the formers and stringers comprises the same shape as eVTOL 200 when installed. In other words, former(s) may form a fuselage's ribs, and the stringers may form the interstitials between such ribs. The spiral orientation of stringers about formers provides uniform robustness at any point on an aircraft fuselage such that if a portion sustains damage, another portion may remain largely unaffected. Aircraft skin would be mechanically coupled to underlying stringers and formers and may interact with a fluid, such as air, to generate lift and perform maneuvers.

In an embodiment, and still referring to FIG. 2, fuselage 204 may comprise monocoque construction. Monocoque construction may include a primary structure that forms a shell (or skin in an aircraft's case) and supports physical loads. Monocoque fuselages are fuselages in which the aircraft skin or shell is also the primary structure. In monocoque construction aircraft skin would support tensile and compressive loads within itself and true monocoque aircraft can be further characterized by the absence of internal structural elements. Aircraft skin in this construction method is rigid and can sustain its shape with no structural assistance form underlying skeleton-like elements. Monocoque fuselage may comprise aircraft skin made from plywood layered in varying grain directions, epoxy-impregnated fiberglass, carbon fiber, or any combination thereof.

According to embodiments, fuselage 204 may include a semi-monocoque construction. Semi-monocoque construction, as used herein, is a partial monocoque construction, wherein a monocoque construction is describe above detail. In semi-monocoque construction, fuselage 204 may derive some structural support from stressed aircraft skin and some structural support from underlying frame structure made of structural elements. Formers or station frames can be seen running transverse to the long axis of fuselage 204 with circular cutouts which are generally used in real-world manufacturing for weight savings and for the routing of electrical harnesses and other modern on-board systems. In a semi-monocoque construction, stringers are the thin, long strips of material that run parallel to fuselage's long axis. Stringers may be mechanically coupled to formers permanently, such as with rivets. Aircraft skin may be mechanically coupled to stringers and formers permanently, such as by rivets as well. A person of ordinary skill in the art will appreciate that there are numerous methods for mechanical fastening of the aforementioned components like crews, nails, dowels, pins, anchors, adhesives like glue or epoxy, or bolts and nuts, to name a few. A subset of fuselage under the umbrella of semi-monocoque construction is unibody vehicles. Unibody, which is short for "unitized body" or alternatively "unitary construction", vehicles are characterized by a construction in which the body, floor plan, and chassis form a single structure. In the aircraft world, unibody would comprise the internal structural elements like formers and stringers are constructed in one piece, integral to the aircraft skin as well as any floor construction like a deck.

Still referring to FIG. 2, stringers and formers which account for the bulk of any aircraft structure excluding monocoque construction can be arranged in a plurality of orientations depending on aircraft operation and materials. Stringers may be arranged to carry axial (tensile or compressive), shear, bending or torsion forces throughout their overall structure. Due to their coupling to aircraft skin, aerodynamic forces exerted on aircraft skin will be transferred to stringers. The location of said stringers greatly informs the type of forces and loads applied to each and every stringer, all of which may be handled by material selection, cross-sectional area, and mechanical coupling methods of each member. The same assessment may be made for formers. In general, formers are significantly larger in cross-sectional area and thickness, depending on location, than stringers. Both stringers and formers may comprise aluminum, aluminum alloys, graphite epoxy composite, steel alloys, titanium, or an undisclosed material alone or in combination.

In an embodiment, and still referring to FIG. 2, stressed skin, when used in semi-monocoque construction is the concept where the skin of an aircraft bears partial, yet significant, load in the overall structural hierarchy. In other words, the internal structure, whether it be a frame of welded tubes, formers and stringers, or some combination, is not sufficiently strong enough by design to bear all loads. The concept of stressed skin is applied in monocoque and semi-monocoque construction methods of fuselage 204. Monocoque comprises only structural skin, and in that sense, aircraft skin undergoes stress by applied aerodynamic fluids imparted by the fluid. Stress as used in continuum mechanics can be described in pound-force per square inch ($lbf/in^2$) or Pascals (Pa). In semi-monocoque construction stressed skin bears part of the aerodynamic loads and additionally imparts force on the underlying structure of stringers and formers.

Still referring to FIG. 2, it should be noted that an illustrative embodiment is presented only, and this disclosure in no way limits the form or construction of eVTOL 200. In embodiments, fuselage 204 may be configurable based on the needs of eVTOL 200 per specific mission or objective. The general arrangement of components, structural elements, and hardware associated with storing and/or moving a payload may be added or removed from fuselage 204 as needed, whether it is stowed manually, automatedly, or removed by personnel altogether. Fuselage 204 may be configurable for a plurality of storage options. Bulkheads and dividers may be installed and uninstalled as needed, as well as longitudinal dividers where necessary. Bulkheads and dividers may be installed using integrated slots and hooks, tabs, boss and channel, or hardware like bolts, nuts, screws, nails, clips, pins, and/or dowels, to name a few. Fuselage 204 may also be configurable to accept certain specific cargo containers, or a receptable that can, in turn, accept certain cargo containers.

Still referring to FIG. 2, eVTOL 200 may include a plurality of laterally extending elements 208 attached to fuselage 204. As used in this disclosure a "laterally extending element" is an element that projects essentially horizontally from fuselage, including an outrigger, a spar, and/or a fixed wing that extends from fuselage. Wings may be structures which include airfoils configured to create a pressure differential resulting in lift. Wings may generally dispose on the left and right sides of the aircraft symmetrically, at a point between nose and empennage. Wings may comprise a plurality of geometries in planform view, swept swing, tapered, variable wing, triangular, oblong, elliptical, square, among others. A wing's cross section may geometry comprises an airfoil. An "airfoil" as used in this disclosure is a shape specifically designed such that a fluid flowing above and below it exert differing levels of pressure against the top and bottom surface. In embodiments, the bottom surface of an aircraft can be configured to generate a greater pressure than does the top, resulting in lift. In an embodiment, and without limitation, wing may include a leading edge. As used in this disclosure a "leading edge" is a foremost edge of an airfoil that first intersects with the external medium. For example, and without limitation, leading edge may include one or more edges that may comprise one or more characteristics such as sweep, radius and/or stagnation point, droop, thermal effects, and the like thereof. In an embodiment, and without limitation, wing may include a trailing edge. As used in this disclosure a "trailing edge" is a rear edge of an airfoil. In an embodiment, and without limitation, trailing edge may include an edge capable of controlling the direction of the departing medium from the wing, such that a controlling force is exerted on the aircraft. Laterally extending element 208 may comprise differing and/or similar cross-sectional geometries over its cord length or the length from wing tip to where wing meets the aircraft's body. One or more wings may be symmetrical about the aircraft's longitudinal plane, which comprises the longitudinal or roll axis reaching down the center of the aircraft through the nose and empennage, and the plane's yaw axis. Laterally extending element may comprise controls surfaces configured to be commanded by a pilot or pilots to change a wing's geometry and therefore its interaction with a fluid medium, like air. Control surfaces may comprise flaps, ailerons, tabs, spoilers, and slats, among others. The control surfaces may dispose on the wings in a plurality of locations and arrangements and in embodiments may be disposed at the leading and trailing edges of the wings, and may be configured to deflect up, down, forward, aft, or a combination thereof. An aircraft, including a dual-mode aircraft may comprise a combination of control surfaces to perform maneuvers while flying or on ground.

Still referring to FIG. 2, eVTOL 200 may include a plurality of lift components 212 attached to the plurality of extending elements 208. As used in this disclosure a "lift component" is a component and/or device used to propel a craft upward by exerting downward force on a fluid medium, which may include a gaseous medium such as air or a liquid medium such as water. Lift component 212 may include any device or component that consumes electrical power on demand to propel an electric aircraft in a direction or other vehicle while on ground or in-flight. For example, and without limitation, lift component 212 may include a rotor, propeller, paddle wheel and the like thereof, wherein a rotor is a component that produces torque along a longitudinal axis, and a propeller produces torquer along a vertical axis. In an embodiment, lift component 212 may include a propulsor. In an embodiment, when a propulsor twists and pulls air behind it, it will, at the same time, push an aircraft forward with an equal amount of force. As a further non-limiting example, lift component 212 may include a thrust element which may be integrated into the propulsor. The thrust element may include, without limitation, a device using moving or rotating foils, such as one or more rotors, an airscrew or propeller, a set of airscrews or propellers such as contra-rotating propellers, a moving or flapping wing, or the like. Further, a thrust element, for example, can include without limitation a marine propeller or screw, an impeller, a turbine, a pump-jet, a paddle or paddle-based device, or the like. The more air pulled behind an aircraft, the greater the force with which the aircraft is pushed forward.

In an embodiment, and still referring to FIG. 2, lift component 212 may include a plurality of blades. As used in this disclosure a "blade" is a propeller that converts rotary motion from an engine or other power source into a swirling slipstream. In an embodiment, blade may convert rotary motion to push the propeller forwards or backwards. In an embodiment lift component 212 may include a rotating power-driven hub, to which are attached several radial airfoil-section blades such that the whole assembly rotates about a longitudinal axis. The blades may be configured at an angle of attack. In an embodiment, and without limitation, angle of attack may include a fixed angle of attack. As used in this disclosure an "fixed angle of attack" is fixed angle between the chord line of the blade and the relative wind. As used in this disclosure a "fixed angle" is an angle that is secured and/or unmovable from the attachment point. For example, and without limitation fixed angle of attack may be 2.8° as a function of a pitch angle of 8.1° and a relative wind angle 5.3°. In another embodiment, and without limitation, angle of attack may include a variable angle of attack. As used in this disclosure a "variable angle of attack" is a variable and/or moveable angle between the chord line of the blade and the relative wind. As used in this disclosure a "variable angle" is an angle that is moveable from the attachment point. For example, and without limitation variable angle of attack may be a first angle of 4.7° as a function of a pitch angle of 7.1° and a relative wind angle 2.4°, wherein the angle adjusts and/or shifts to a second angle of 2.7° as a function of a pitch angle of 5.1° and a relative wind angle 2.4°. In an embodiment, angle of attack be configured to produce a fixed pitch angle. As used in this disclosure a "fixed pitch angle" is a fixed angle between a cord line of a blade and the rotational velocity direction. For example, and without limitation, fixed pitch angle may include 18°. In another embodiment fixed angle of attack may be manually variable to a few set positions to adjust one or more lifts of the aircraft prior to flight. In an embodiment, blades for an aircraft are designed to be fixed to their hub at an angle similar to the thread on a screw makes an angle to the shaft; this angle may be referred to as a pitch or pitch angle which will determine the speed of the forward movement as the blade rotates.

In an embodiment, and still referring to FIG. 2, lift component 212 may be configured to produce a lift. As used in this disclosure a "lift" is a perpendicular force to the oncoming flow direction of fluid surrounding the surface. For example, and without limitation relative air speed may be horizontal to eVTOL 200, wherein the lift force may be a force exerted in the vertical direction, directing eVTOL 200 upwards. In an embodiment, and without limitation, lift component 212 may produce lift as a function of applying a torque to lift component. As used in this disclosure a "torque" is a measure of force that causes an object to rotate about an axis in a direction. For example, and without limitation, torque may rotate an aileron and/or rudder to generate a force that may adjust and/or affect altitude, airspeed velocity, groundspeed velocity, direction during flight, and/or thrust. In an embodiment, and without limitation, lift component 212 may receive a source of power and/or energy from a power sources may apply a torque on lift component 212 to produce lift. As used in this disclosure a "power source" is a source that that drives and/or controls any component attached to eVTOL 200. For example, and without limitation power source may include a motor that operates to move one or more lift components, to drive one or more blades, or the like thereof. A motor may be driven by direct current (DC) electric power and may include, without limitation, brushless DC electric motors, switched reluctance motors, induction motors, or any combination thereof. A motor may also include electronic speed controllers or other components for regulating motor speed, rotation direction, and/or dynamic braking.

Still referring to FIG. 2, power source may include an energy source. An energy source may include, for example, a generator, a photovoltaic device, a fuel cell such as a hydrogen fuel cell, direct methanol fuel cell, and/or solid oxide fuel cell, an electric energy storage device (e.g. a capacitor, an inductor, and/or a battery). An energy source may also include a battery cell, or a plurality of battery cells connected in series into a module and each module connected in series or in parallel with other modules. Configuration of an energy source containing connected modules may be designed to meet an energy or power requirement and may be designed to fit within a designated footprint in an electric aircraft in which eVTOL 200 may be incorporated.

In an embodiment, and still referring to FIG. 2, an energy source may be used to provide a steady supply of electrical power to a load over the course of a flight by a vehicle or other electric aircraft. For example, the energy source may be capable of providing sufficient power for "cruising" and other relatively low-energy phases of flight. An energy source may also be capable of providing electrical power for some higher-power phases of flight as well, particularly when the energy source is at a high SOC, as may be the case for instance during takeoff. In an embodiment, the energy source may be capable of providing sufficient electrical power for auxiliary loads including without limitation, lighting, navigation, communications, de-icing, steering or other systems requiring power or energy. Further, the energy source may be capable of providing sufficient power for controlled descent and landing protocols, including, without limitation, hovering descent or runway landing. As used herein the energy source may have high power density where the electrical power an energy source can usefully produce per unit of volume and/or mass is relatively high. The electrical power is defined as the rate of electrical energy per unit time. An energy source may include a device for which power that may be produced per unit of volume and/or mass has been optimized, at the expense of the maximal total specific energy density or power capacity, during design. Non-limiting examples of items that may be used as at least an energy source may include batteries used for starting applications including Li ion batteries which may include NCA, NMC, Lithium iron phosphate (LiFePO4) and Lithium Manganese Oxide (LMO) batteries, which may be mixed with another cathode chemistry to provide more specific power if the application requires Li metal batteries, which have a lithium metal anode that provides high power on demand, Li ion batteries that have a silicon or titanite anode, energy source may be used, in an embodiment, to provide electrical power to an electric aircraft or drone, such as an electric aircraft vehicle, during moments requiring high rates of power output, including without limitation takeoff, landing, thermal de-icing and situations requiring greater power output for reasons of stability, such as high turbulence situations, as described in further detail below. A battery may include, without limitation a battery using nickel based chemistries such as nickel cadmium or nickel metal hydride, a battery using lithium ion battery chemistries such as a nickel cobalt aluminum (NCA), nickel manganese cobalt (NMC), lithium iron phosphate (LiFePO4), lithium cobalt oxide (LCO), and/or lithium manganese oxide (LMO), a battery using lithium polymer technology, lead-based batteries such as without limitation lead acid batteries, metal-air batteries, or any other suitable battery. Persons skilled in the art, upon reviewing the entirety of this disclosure, will be aware of various devices of components that may be used as an energy source.

Still referring to FIG. 2, an energy source may include a plurality of energy sources, referred to herein as a module of energy sources. The module may include batteries connected in parallel or in series or a plurality of modules connected either in series or in parallel designed to deliver both the power and energy requirements of the application. Connecting batteries in series may increase the voltage of at least an energy source which may provide more power on demand. High voltage batteries may require cell matching when high peak load is needed. As more cells are connected in strings, there may exist the possibility of one cell failing which may increase resistance in the module and reduce the overall power output as the voltage of the module may decrease as a result of that failing cell. Connecting batteries in parallel may increase total current capacity by decreasing total resistance, and it also may increase overall amp-hour capacity. The overall energy and power outputs of at least an energy source may be based on the individual battery cell performance or an extrapolation based on the measurement of at least an electrical parameter. In an embodiment where the energy source includes a plurality of battery cells, the overall power output capacity may be dependent on the electrical parameters of each individual cell. If one cell experiences high self-discharge during demand, power drawn from at least an energy source may be decreased to avoid damage to the weakest cell. The energy source may further include, without limitation, wiring, conduit, housing, cooling system and battery management system. Persons skilled in the art will be aware, after reviewing the entirety of this disclosure, of many different components of an energy source.

Still referring to FIG. 2, eVTOL 200 may include at least a longitudinal thrust component 216. As used in this disclosure a "longitudinal thrust component" is a flight component that is mounted such that the component thrusts the flight component through a medium. As a non-limiting example, longitudinal thrust flight component 216 may include a pusher flight component such as a pusher propeller, a pusher motor, a pusher propulsor, and the like. Additionally, or alternatively, pusher flight component may include a plurality of pusher flight components. As a further non-limiting example, longitudinal thrust flight component may include a puller flight component such as a puller propeller, a puller motor, a puller propulsor, and the like. Additionally, or alternatively, puller flight component may include a plurality of puller flight components.

Figure 3:
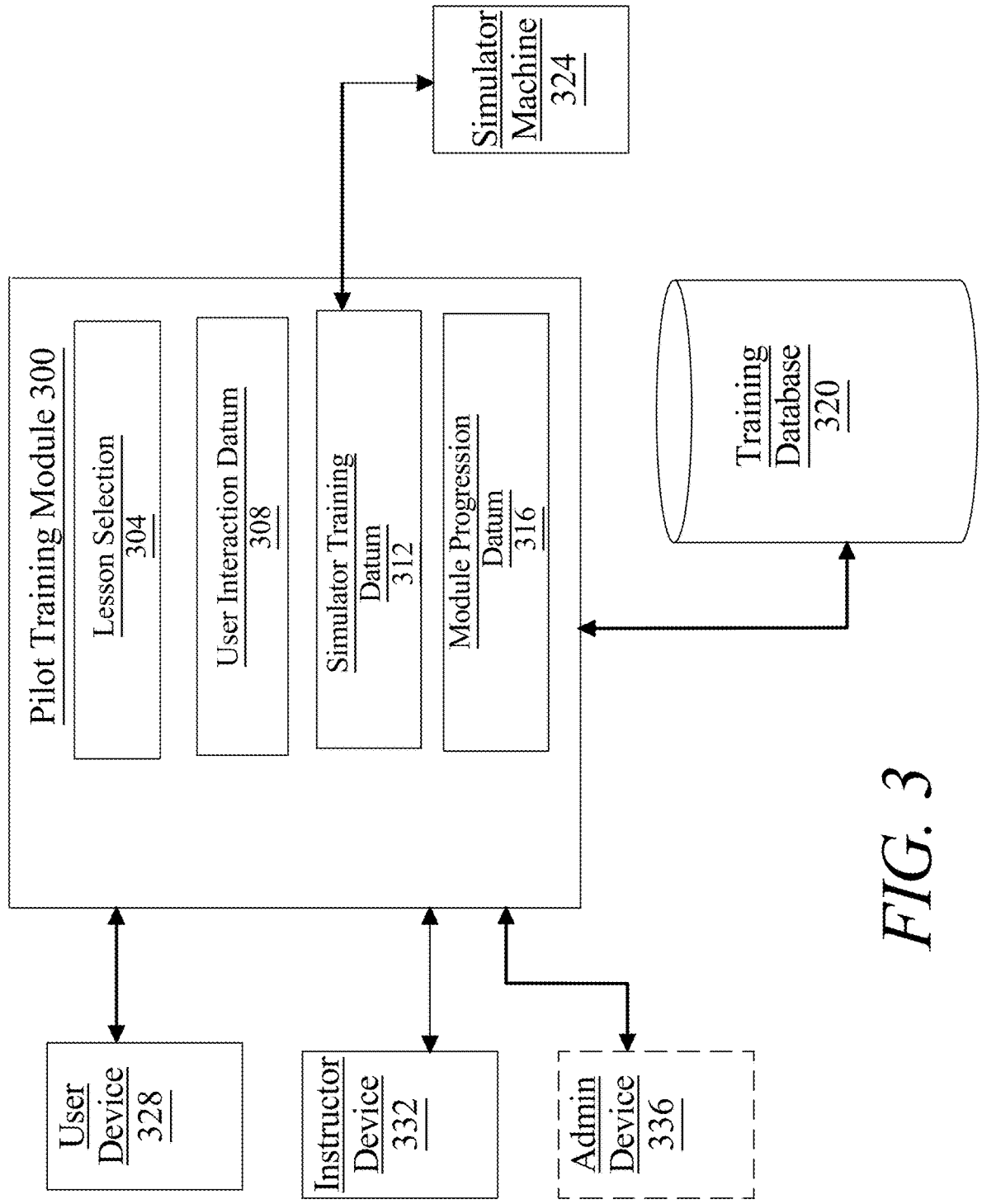
FIG. 3 is a block diagram illustrating a pilot training module.

Now referring to FIG. 3, a block diagram of a pilot training module 300 is shown. Pilot training module 300 may include any suitable software and/or hardware module as described in the entirety of this disclosure. In an embodiment, pilot training module 300 may be configured to receive a lesson selection 304 from user device 328. In some embodiments, user device 328 may include a pilot control. The "lesson selection" as used in the entirety of this disclosure, is the lesson module of the plurality of lesson modules user device 328 has selected to engage with. The lesson module may include any lesson module as described in the entirety of this disclosure. Lesson selection 304 may include a lesson and/or sub-topic of the coursework required to become an electric aircraft certified pilot. Receiving lesson selection from user device 328 may include selecting a lesson module from a drop-down menu of the plurality of lesson modules, a list, a visual display, and the like. Lesson selection 304 may include, as an example and without limitation, the lesson module next to complete in the electric aircraft pilot certification.

With continued reference to FIG. 3, pilot training module 300 may be configured to transmit a plurality of lesson modules from training database 320 to user device 328 as a function of lesson selection 304. Pilot training module 300 may include or communicate with training database 320. Training database 320 may be implemented as any database and/or datastore suitable for use as training database 320 as described in the entirety of this disclosure. In some embodiments, pilot training module 300 may include a plurality of lesson modules. The plurality of lesson modules may include a collection of data correlated to each course of the plurality of courses required to become a certified electric aircraft pilot. Each course of the plurality of courses may include, for example and without limitation, foundational knowledge, such as definitions, classifications, history and industry information, aircraft and pilot knowledge, such as aircraft instruments, aircraft systems, aeromedical factors and aeronautical decision making, flying environment knowledge, such as airspace, airports, aviation weather, and navigation, regulatory knowledge, such as aircraft classifications, federal aviation administration, flight schools, pilot certifications, in-flight knowledge, such as hovering maneuvers, vertical takeoff and landing, turning, instrument indicators, and emergency operations, and the like. Each lesson module of the plurality of lesson modules may include assessments and activities to be completed by the user utilizing user device 328 and simulator machine 324. Each lesson module may be designed to enable a user associated with user device 328 to become proficient at each course of the plurality of courses required to become a certified electric aircraft pilot. In an embodiment, the courses required to become a certified electric aircraft pilot may include any coursework from any aircraft certification and/or permission, such as, for example and without limitation, fixed conventional, fixed wing complex, light sport, private pilot, instrument, complex, multi-engine, high performance, tail wheel, sea plane, rotorcraft, powered lift, commercial, ATP, any combination thereof, and/or the like. Persons skilled in the art, upon reviewing the entirety of this disclosure, will be aware of various courses and/or coursework that may represent the plurality of lesson modules consistently with this disclosure.

Still referring to FIG. 3, pilot training module 300 may be further configured to receive an interaction datum 308 from user device 328. Each interaction datum 308 may correspond to a respective lesson module of the plurality of lesson modules, such that interaction datum 308 may include the latest interactions of user device 328 with pilot training module 300, including the data associated with the interaction, such as a mouse click, a gesture on a touch screen, a keyboard stroke, movement of an input device (e.g a joystick, switch, button, etc), voice command, or any combination thereof, to name a few. Each interaction datum 308 may include, for example and without limitation, an interaction with a displayed reading, activity, assessment, and the like. Each interaction datum 308 may include a set of answers for an assessment, a typographical entry correlating to an answer to a question, a video response, any combination thereof, and/or the like. An interaction datum 308 may be configured to correlate to the position of a user and/or user device 328 within the plurality of lesson modules. Pilot training module 300 may be further configured to receive at least a simulator training datum 312 from simulator machine 324. Simulator machine 324 may include any simulator machine as described in the entirety of this disclosure. Each simulator training datum 312 may be correlated to a respective lesson module of the plurality of lesson modules, such that the respective simulator training datum 312 may include the latest interactions of simulator machine 324 with pilot training module 300, including the data associated with the interaction. A simulator training datum 312 may include, for example and without limitation, data associated with a simulation flight utilizing simulator machine 324. The simulation flight utilizing simulator machine 324 may be utilized as an assessment, practice, and the like. Simulator training datum 312 may also include, for example and without limitation, data representing an interaction with simulator machine 324 wherein the user is performing a maneuver, skill, and/or technique included in each lesson module of the plurality of lesson modules. Simulator training datum 312 may further include any type of media, for example and without limitation, a video of the simulation flight, a textual summary of the simulator flight, a notification of a completed maneuver, and the like. The latest received simulator training datum 312 may be correlated with the position of the user and/or user device 328 within the plurality of lesson modules. Persons skilled in the art, upon reviewing the entirety of this disclosure, will be aware of various inputs that may represent the at least an interaction datum and the at least a simulator training datum consistently with this disclosure.

Continuing to refer to FIG. 3, pilot training module 300 may be further configured to record a module progression datum 316 for user device 328 in training database 320 for each lesson module of the plurality of lesson modules as a function of the at least a user device interaction datum 308 and a simulator training datum 312. The "module progression datum" as described in the entirety of this disclosure, is the furthest point of progress of user device 328 of the plurality of modules for each authenticated use of user device 324. Module progression datum 316 may include, for example and without limitation, data representing that user device 328 is halfway through an assignment of a lesson module of the plurality of lesson modules. For example and without limitation, module progression datum 316 may include three interaction datum 308 received from user device 328, however the lesson is not complete until two at least a simulator training datum 312 are received from simulator machine 324. In the non-limiting example, pilot training module 300 will record module progression datum 316, detailing the progress of the user and/or user device 328, in training database 320. As a further example and without limitation, module progression datum 316 may include data representing that user device 328 is repeatedly failing a simulator maneuver assignment, such as when the user has to perform a specific technique in simulator machine 324. Further module progression datum 316 may include data indicating that all required interaction datum 308 have been received from user device 328 but further that a simulator training datum 312 successfully performing the maneuver technique has not been received from simulator machine 324. In embodiments, pilot training module 300 may record module progression datum 316, detailing the progress of the user and/or user device of the particular lesson modules of the plurality of lesson modules, in training database 320. Persons skilled in the art, upon reviewing the entirety of this disclosure, will be aware of various datums that may represent the module progression datum consistently with this disclosure.

With continued reference to FIG. 3, in an embodiment, instructor device 332 may be configured to communicate with pilot training module 300 utilizing any means of communication as described in the entirety of this disclosure. Instructor device 332 may be configured to access any data tables and/or data set included in training database 320. Instructor device 332 may include any instructor device as described in the entirety of this disclosure. In an embodiment, admin device 336 may be configured to communicate with pilot training module 300 utilizing any means of communication as described in the entirety of this disclosure. Admin device 336 may be configured to access any data tables and/or data set included in training database 320 or other database associated with pilot training module 300.

Figure 4:
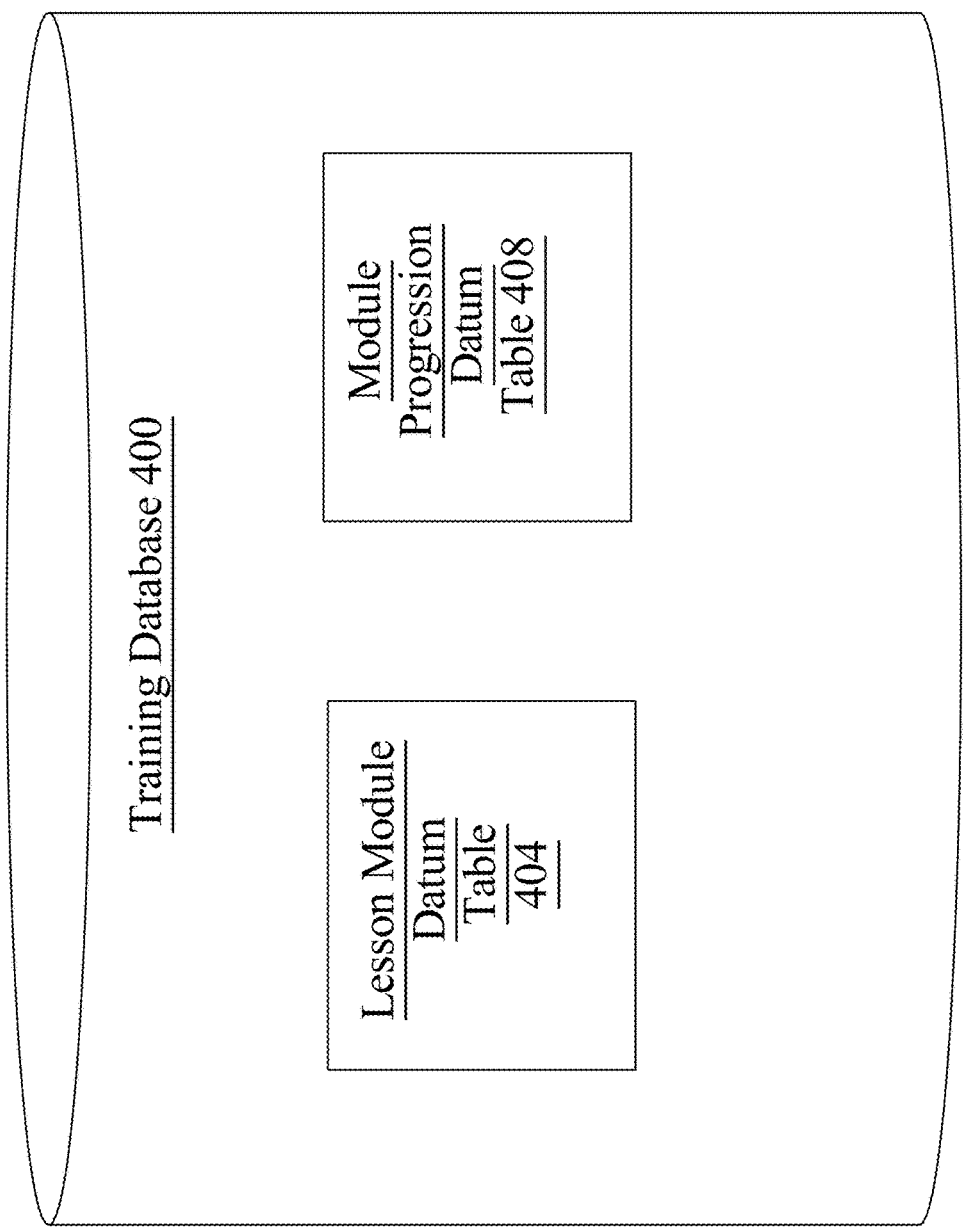
FIG. 4 is a block diagram illustrating a training database.

Referring now to FIG. 4, an embodiment of training database 400 is illustrated. Training database 400 may include any data structure for ordered storage and retrieval of data, which may be implemented as a hardware or software module. Training database 400 may be implemented, without limitation, as a relational database, a key-value retrieval datastore such as a NOSQL database, or any other format or structure for use as a datastore that a person skilled in the art would recognize as suitable upon review of the entirety of this disclosure. Training database 400 may include a plurality of data entries and/or records corresponding to verification elements as described above. Data entries and/or records may describe, without limitation, data concerning authentication datum and failed authentication datum. One or more database tables in training database 400 may include, as a non-limiting example, a lesson module datum table 404. Lesson module datum table 404 may include a table storing the plurality of lesson modules. For instance, and without limitation, training database 400 may include a lesson module datum table 404 listing each lesson module of the plurality of lesson modules. One or more database tables in training database 400 may include, as a non-limiting example, a module progression datum table 408. Module progression datum table 408 may be a table storing module progression datum and/or associating lesson selection to the stored module progression datum. For instance, and without limitation, training database 400 may include a module progression datum table 408 listing module progression datum correlated to each lesson module of the plurality of lesson modules.

Figure 5:
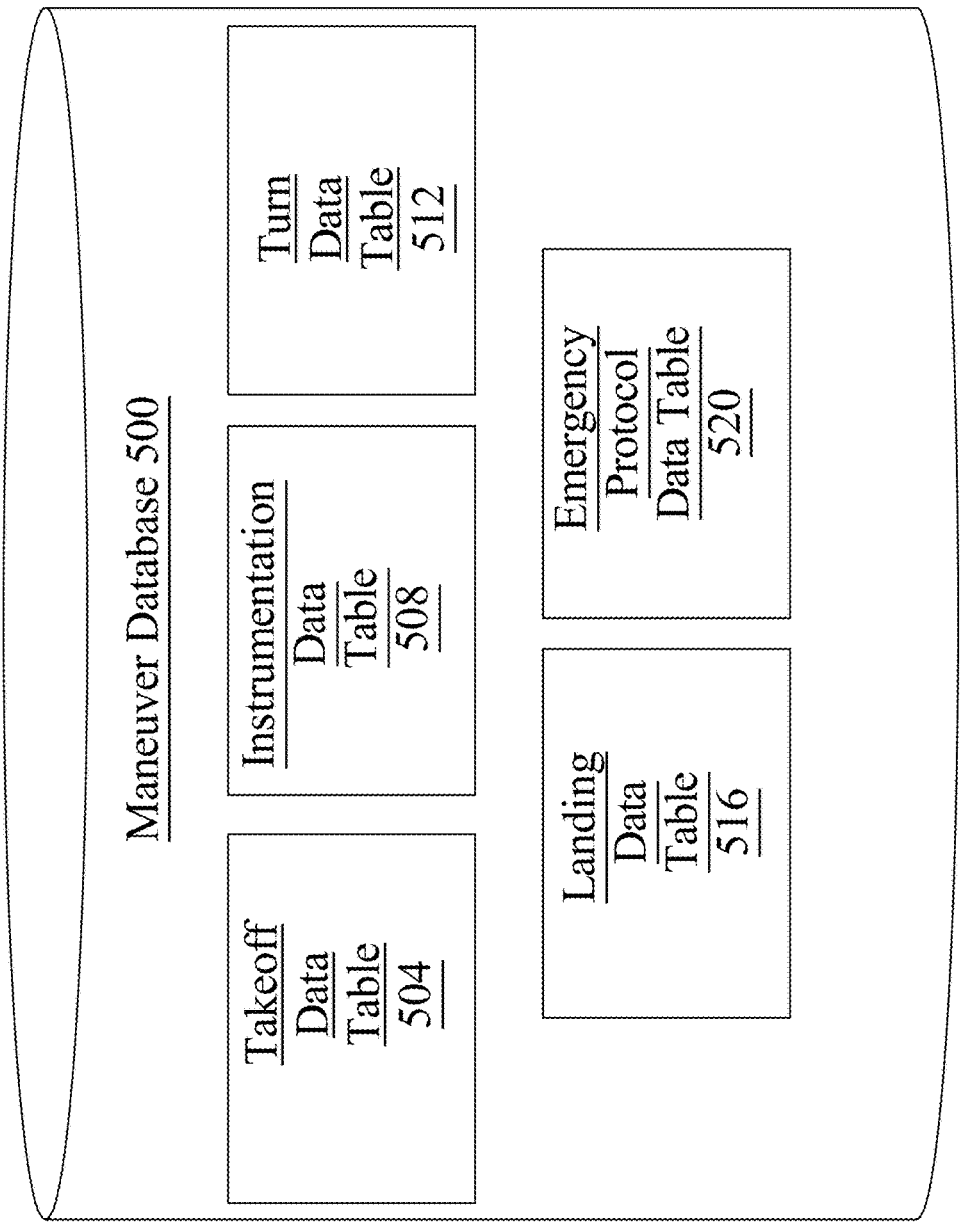
FIG. 5 is a block diagram illustrating a maneuver database.

Referring now to FIG. 5, an embodiment of maneuver database 500 is illustrated. Maneuver database 500 may include any data structure for ordered storage and retrieval of data, which may be implemented as a hardware or software module. Maneuver database 500 may be implemented, without limitation, as a relational database, a key-value retrieval datastore such as a NOSQL database, or any other format or structure for use as a datastore that a person skilled in the art would recognize as suitable upon review of the entirety of this disclosure. Maneuver database 500 may include a plurality of data entries and/or records corresponding to elements of flight movement data as described above. Data entries and/or records may describe, without limitation, data concerning particular aircraft procedures, techniques, and skills that have been collected by an electric aircraft. Data entries in a maneuver database 500 may be flagged with or linked to one or more additional elements of information, which may be reflected in data entry cells and/or in linked tables such as tables related by one or more indices in a relational database; one or more additional elements of information may include data associating a flight procedure with one or more cohorts, including aircraft type groupings, such as fixed conventional, fixed wing complex, light sport, private pilot, instrument, complex, multi-engine, high performance, tail wheel, sea plane, rotorcraft, powered lift, commercial, VTOL, eVTOL, or the like. Additional elements of information may include one or more categories of flight movement data as described above. Persons skilled in the art, upon reviewing the entirety of this disclosure, will be aware of various ways in which data entries in a maneuver database 500 may reflect categories, cohorts, and/or populations of data consistently with this disclosure.

Still referring to FIG. 5, one or more database tables in maneuver database 500 may include, as a non-limiting example, a takeoff data table 504. Takeoff data table 504 may be a table storing takeoff data of flight movement data. Takeoff data table 504 may further include, without limitation, correlating a plurality of tactile movement data to takeoff data of flight movement data. For instance, and without limitation, maneuver database 500 may include a takeoff data table 504 listing takeoff data such as runway alignment, threshold of takeoff pitch attitude, threshold of takeoff bank attitude, threshold of takeoff heading of the aircraft, threshold of takeoff airspeed, threshold of rotor speed for vertical takeoff, and the like. Maneuver database 500 may include, as a non-limiting example, an instrumentation data table 508. For instance, and without limitation, maneuver database 500 may include an instrumentation data table 508 listing instrumentation data, such as a threshold of vertical speed, threshold of attitude, threshold of altimeter, threshold of airspeed of horizontal flight, and the like. As another non-limiting example, maneuver database 500 may include a turn data table 512, which may list turn data, such as threshold of bank angle for a shallow turn, threshold of bank angle for a medium turn, threshold of bank angle for steep turns, threshold of yaw in the direction of the turn, threshold of yaw in the direction opposite the turn, threshold of airspeed during turn, threshold of heading of the aircraft during turns, and the like. As a further non-limiting example, maneuver database 500 may include a landing data table 516, which may list landing data, such as runway alignment, threshold angle of vertical descent, threshold of angle of landing, threshold of landing pitch attitude, threshold of landing bank attitude, threshold of heading of the aircraft during landing, threshold of landing airspeed, threshold of vibrational frequency during landing, threshold of rotor speed for vertical landing, and the like. As a further example, also non-limiting, maneuver database 500 may include an emergency protocol data table 520, which may list emergency protocol data, such as a threshold of time to recovery of a system malfunction and/or failure, such as power failure in a rotor, power failure in a propeller, damage to a wing, damage to the fuselage, dynamic rollover, damage to a rotor, malfunction with the collective, malfunction with the inceptor stick, and the like, threshold attitude during a malfunction, threshold level of hover, and the like. Tables presented above are presented for exemplary purposes only; persons skilled in the art will be aware of various ways in which data may be organized in maneuver database 500 consistently with this disclosure.

Figure 6:
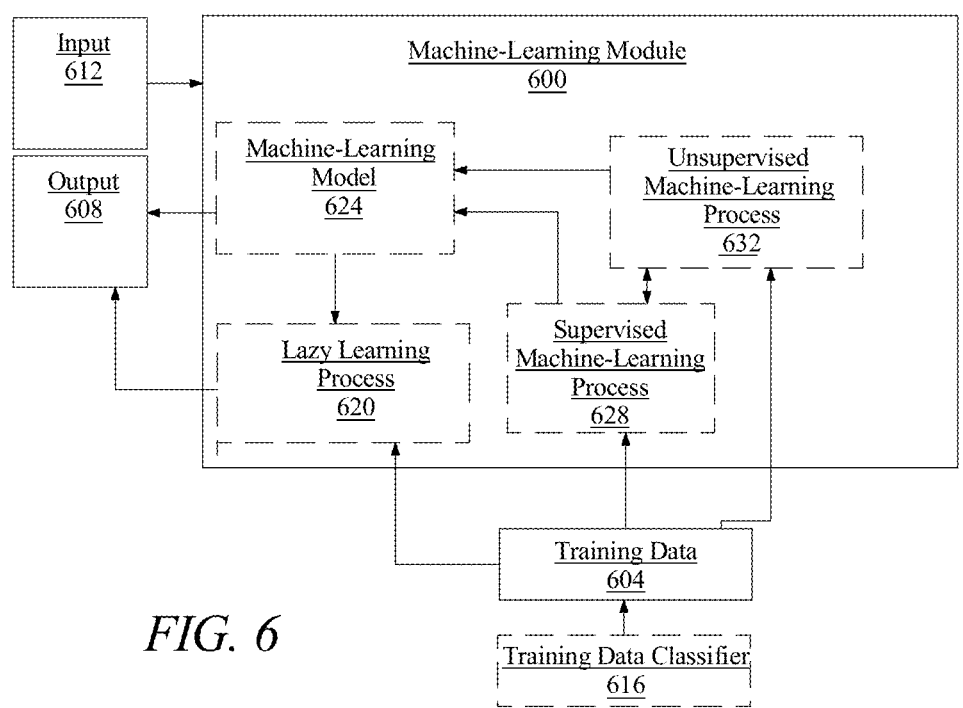
FIG. 6 is a block diagram illustrating a machine learning system.

Referring now to FIG. 6, an exemplary embodiment of a machine-learning module 600 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 604 to generate an algorithm that will be performed by a computing device/module to produce outputs 608 given data provided as inputs 612; this is in contrast to a non-machine learning software program where the commands to be executed are determined in advance by a user and written in a programming language.

Still referring to FIG. 6, "training data," as used herein, is data containing correlations that a machine-learning process may use to model relationships between two or more categories of data elements. For instance, and without limitation, training data 604 may include a plurality of data entries, each entry representing a set of data elements that were recorded, received, and/or generated together; data elements may be correlated by shared existence in a given data entry, by proximity in a given data entry, or the like. Multiple data entries in training data 604 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 604 according to various correlations; correlations may indicate causative and/or predictive links between categories of data elements, which may be modeled as relationships such as mathematical relationships by machine-learning processes as described in further detail below. Training data 604 may be formatted and/or organized by categories of data elements, for instance by associating data elements with one or more descriptors corresponding to categories of data elements. As a non-limiting example, training data 604 may include data entered in standardized forms by persons or processes, such that entry of a given data element in a given field in a form may be mapped to one or more descriptors of categories. Elements in training data 604 may be linked to descriptors of categories by tags, tokens, or other data elements; for instance, and without limitation, training data 604 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 6, training data 604 may include one or more elements that are not categorized; that is, training data 604 may not be formatted or contain descriptors for some elements of data. Machine-learning algorithms and/or other processes may sort training data 604 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 604 to be made applicable for two or more distinct machine-learning algorithms as described in further detail below. Training data 604 used by machine-learning module 600 may correlate any input data as described in this disclosure to any output data as described in this disclosure. As a non-limiting illustrative example flight elements and/or pilot signals may be inputs, wherein an output may be an autonomous function.

Further referring to FIG. 6, training data may be filtered, sorted, and/or selected using one or more supervised and/or unsupervised machine-learning processes and/or models as described in further detail below; such models may include without limitation a training data classifier 616. Training data classifier 616 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 600 may generate a classifier using a classification algorithm, defined as a processes whereby a computing device and/or any module and/or component operating thereon derives a classifier from training data 604. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 616 may classify elements of training data to sub-categories of flight elements such as torques, forces, thrusts, directions, and the like thereof.

Still referring to FIG. 6, machine-learning module 600 may be configured to perform a lazy-learning process 620 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 604. Heuristic may include selecting some number of highest-ranking associations and/or training data 604 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 6, machine-learning processes as described in this disclosure may be used to generate machine-learning models 624. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 624 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 624 may be generated by creating an artificial neural network, such as a convolutional neural network comprising an input layer of nodes, one or more intermediate layers, and an output layer of nodes. Connections between nodes may be created via the process of "training" the network, in which elements from a training data 604 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 6, machine-learning algorithms may include at least a supervised machine-learning process 628.

At least a supervised machine-learning process 628, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include flight elements and/or pilot signals as described above as inputs, autonomous functions as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 604. Persons skilled in the art, upon reviewing the entirety of this disclosure, will be aware of various possible variations of at least a supervised machine-learning process 628 that may be used to determine relation between inputs and outputs. Supervised machine-learning processes may include classification algorithms as defined above.

Further referring to FIG. 6, machine learning processes may include at least an unsupervised machine-learning processes 632. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 6, machine-learning module 600 may be designed and configured to create a machine-learning model 624 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 6, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 7:
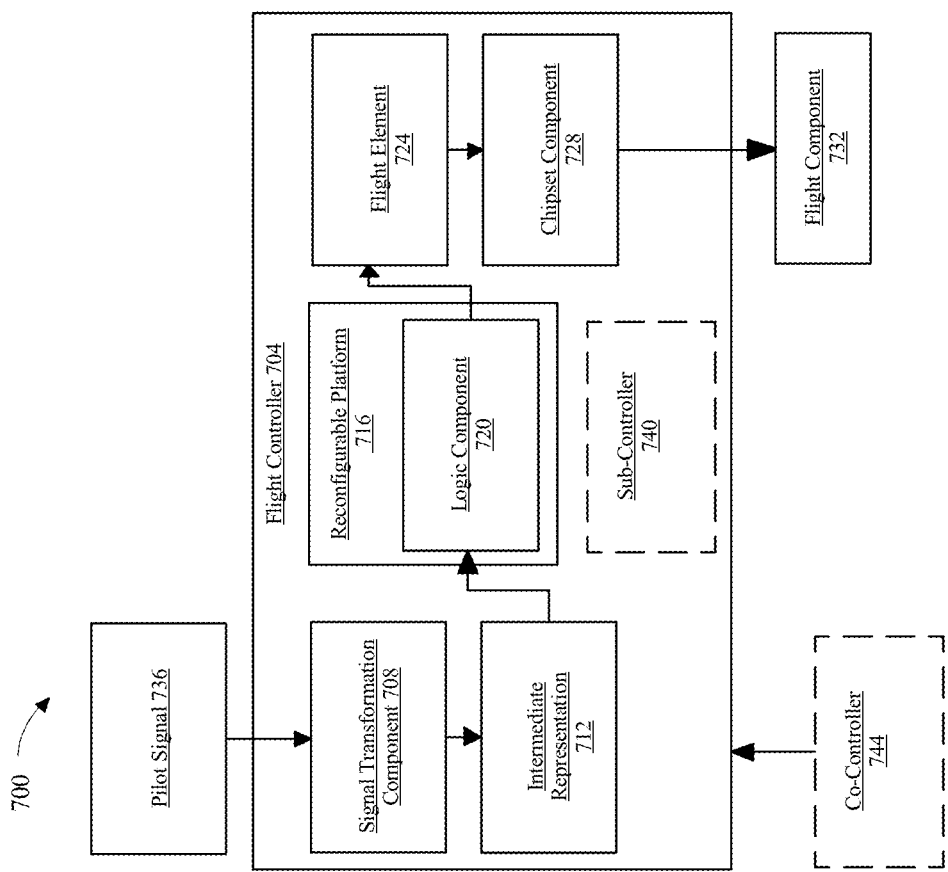
FIG. 7 is a block diagram of an exemplary embodiment of a flight controller.

Now referring to FIG. 7, an exemplary embodiment 700 of a flight controller 704 is illustrated. As used in this disclosure a "flight controller" is a computing device of a plurality of computing devices dedicated to data storage, security, distribution of traffic for load balancing, and flight instruction. Flight controller 704 may include and/or communicate with any computing device as described in this disclosure, including without limitation a microcontroller, microprocessor, digital signal processor (DSP) and/or system on a chip (SoC) as described in this disclosure. Further, flight controller 704 may include a single computing device operating independently, or may include two or more computing device operating in concert, in parallel, sequentially or the like; two or more computing devices may be included together in a single computing device or in two or more computing devices. In embodiments, flight controller 704 may be installed in an aircraft, may control the aircraft remotely, and/or may include an element installed in the aircraft and a remote element in communication therewith.

In an embodiment, and still referring to FIG. 7, flight controller 704 may include a signal transformation component 708. As used in this disclosure a "signal transformation component" is a component that transforms and/or converts a first signal to a second signal, wherein a signal may include one or more digital and/or analog signals. For example, and without limitation, signal transformation component 708 may be configured to perform one or more operations such as preprocessing, lexical analysis, parsing, semantic analysis, and the like thereof. In an embodiment, and without limitation, signal transformation component 708 may include one or more analog-to-digital convertors that transform a first signal of an analog signal to a second signal of a digital signal. For example, and without limitation, an analog-to-digital converter may convert an analog input signal to a 10-bit binary digital representation of that signal. In another embodiment, signal transformation component 708 may include transforming one or more low-level languages such as, but not limited to, machine languages and/or assembly languages. For example, and without limitation, signal transformation component 708 may include transforming a binary language signal to an assembly language signal. In an embodiment, and without limitation, signal transformation component 708 may include transforming one or more high-level languages and/or formal languages such as but not limited to alphabets, strings, and/or languages. For example, and without limitation, high-level languages may include one or more system languages, scripting languages, domain-specific languages, visual languages, esoteric languages, and the like thereof. As a further non-limiting example, high-level languages may include one or more algebraic formula languages, business data languages, string and list languages, object-oriented languages, and the like thereof.

Still referring to FIG. 7, signal transformation component 708 may be configured to optimize an intermediate representation 712. As used in this disclosure an "intermediate representation" is a data structure and/or code that represents the input signal. Signal transformation component 708 may optimize intermediate representation as a function of a data-flow analysis, dependence analysis, alias analysis, pointer analysis, escape analysis, and the like thereof. In an embodiment, and without limitation, signal transformation component 708 may optimize intermediate representation 712 as a function of one or more inline expansions, dead code eliminations, constant propagation, loop transformations, and/or automatic parallelization functions. In another embodiment, signal transformation component 708 may optimize intermediate representation as a function of a machine dependent optimization such as a peephole optimization, wherein a peephole optimization may rewrite short sequences of code into more efficient sequences of code. Signal transformation component 708 may optimize intermediate representation to generate an output language, wherein an "output language," as used herein, is the native machine language of flight controller 704. For example, and without limitation, native machine language may include one or more binary and/or numerical languages.

In an embodiment, and without limitation, signal transformation component 708 may include transform one or more inputs and outputs as a function of an error correction code. An error correction code, also known as error correcting code (ECC), is an encoding of a message or lot of data using redundant information, permitting recovery of corrupted data. An ECC may include a block code, in which information is encoded on fixed-size packets and/or blocks of data elements such as symbols of predetermined size, bits, or the like. Reed-Solomon coding, in which message symbols within a symbol set having q symbols are encoded as coefficients of a polynomial of degree less than or equal to a natural number k, over a finite field F with q elements; strings so encoded have a minimum hamming distance of k+1, and permit correction of (q-k-1)/2 erroneous symbols. Block code may alternatively or additionally be implemented using Golay coding, also known as binary Golay coding, Bose-Chaudhuri, Hocquenghuem (BCH) coding, multidimensional parity-check coding, and/or Hamming codes. An ECC may alternatively or additionally be based on a convolutional code.

In an embodiment, and still referring to FIG. 7, flight controller 704 may include a reconfigurable hardware platform 716. A "reconfigurable hardware platform," as used herein, is a component and/or unit of hardware that may be reprogrammed, such that, for instance, a data path between elements such as logic gates or other digital circuit elements may be modified to change an algorithm, state, logical sequence, or the like of the component and/or unit. This may be accomplished with such flexible high-speed computing fabrics as field-programmable gate arrays (FPGAs), which may include a grid of interconnected logic gates, connections between which may be severed and/or restored to program in modified logic. Reconfigurable hardware platform 716 may be reconfigured to enact any algorithm and/or algorithm selection process received from another computing device and/or created using machine-learning processes.

Still referring to FIG. 7, reconfigurable hardware platform 716 may include a logic component 720. As used in this disclosure a "logic component" is a component that executes instructions on output language. For example, and without limitation, logic component may perform basic arithmetic, logic, controlling, input/output operations, and the like thereof. Logic component 720 may include any suitable processor, such as without limitation a component incorporating logical circuitry for performing arithmetic and logical operations, such as an arithmetic and logic unit (ALU), which may be regulated with a state machine and directed by operational inputs from memory and/or sensors; logic component 720 may be organized according to Von Neumann and/or Harvard architecture as a non-limiting example. Logic component 720 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC). In an embodiment, logic component 720 may include one or more integrated circuit microprocessors, which may contain one or more central processing units, central processors, and/or main processors, on a single metal-oxide-semiconductor chip. Logic component 720 may be configured to execute a sequence of stored instructions to be performed on the output language and/or intermediate representation 712. Logic component 720 may be configured to fetch and/or retrieve the instruction from a memory cache, wherein a "memory cache," as used in this disclosure, is a stored instruction set on flight controller 704. Logic component 720 may be configured to decode the instruction retrieved from the memory cache to opcodes and/or operands. Logic component 720 may be configured to execute the instruction on intermediate representation 712 and/or output language. For example, and without limitation, logic component 720 may be configured to execute an addition operation on intermediate representation 712 and/or output language.

In an embodiment, and without limitation, logic component 720 may be configured to calculate a flight element 724. As used in this disclosure a "flight element" is an element of datum denoting a relative status of aircraft. For example, and without limitation, flight element 724 may denote one or more torques, thrusts, airspeed velocities, forces, altitudes, groundspeed velocities, directions during flight, directions facing, forces, orientations, and the like thereof. For example, and without limitation, flight element 724 may denote that aircraft is cruising at an altitude and/or with a sufficient magnitude of forward thrust. As a further non-limiting example, flight status may denote that is building thrust and/or groundspeed velocity in preparation for a takeoff. As a further non-limiting example, flight element 724 may denote that aircraft is following a flight path accurately and/or sufficiently.

Still referring to FIG. 7, flight controller 704 may include a chipset component 728. As used in this disclosure a "chipset component" is a component that manages data flow. In an embodiment, and without limitation, chipset component 728 may include a northbridge data flow path, wherein the northbridge dataflow path may manage data flow from logic component 720 to a high-speed device and/or component, such as a RAM, graphics controller, and the like thereof. In another embodiment, and without limitation, chipset component 728 may include a southbridge data flow path, wherein the southbridge dataflow path may manage data flow from logic component 720 to lower-speed peripheral buses, such as a peripheral component interconnect (PCI), industry standard architecture (ICA), and the like thereof. In an embodiment, and without limitation, southbridge data flow path may include managing data flow between peripheral connections such as ethernet, USB, audio devices, and the like thereof. Additionally or alternatively, chipset component 728 may manage data flow between logic component 720, memory cache, and a flight component 732. As used in this disclosure a "flight component" is a portion of an aircraft that can be moved or adjusted to affect one or more flight elements. For example, flight component 732 may include a component used to affect the aircrafts' roll and pitch which may comprise one or more ailerons. As a further example, flight component 732 may include a rudder to control yaw of an aircraft. In an embodiment, chipset component 728 may be configured to communicate with a plurality of flight components as a function of flight element 724. For example, and without limitation, chipset component 728 may transmit to an aircraft rotor to reduce torque of a first lift propulsor and increase the forward thrust produced by a pusher component to perform a flight maneuver.

In an embodiment, and still referring to FIG. 7, flight controller 704 may be configured generate an autonomous function. As used in this disclosure an "autonomous function" is a mode and/or function of flight controller 704 that controls aircraft automatically. For example, and without limitation, autonomous function may perform one or more aircraft maneuvers, take offs, landings, altitude adjustments, flight leveling adjustments, turns, climbs, and/or descents. As a further non-limiting example, autonomous function may adjust one or more airspeed velocities, thrusts, torques, and/or groundspeed velocities. As a further non-limiting example, autonomous function may perform one or more flight path corrections and/or flight path modifications as a function of flight element 724. In an embodiment, autonomous function may include one or more modes of autonomy such as, but not limited to, autonomous mode, semi-autonomous mode, and/or non-autonomous mode. As used in this disclosure "autonomous mode" is a mode that automatically adjusts and/or controls aircraft and/or the maneuvers of aircraft in its entirety. For example, autonomous mode may denote that flight controller 704 will adjust the aircraft. As used in this disclosure a "semi-autonomous mode" is a mode that automatically adjusts and/or controls a portion and/or section of aircraft. For example, and without limitation, semi-autonomous mode may denote that a pilot will control the propulsors, wherein flight controller 704 will control the ailerons and/or rudders. As used in this disclosure "non-autonomous mode" is a mode that denotes a pilot will control aircraft and/or maneuvers of aircraft in its entirety.

In an embodiment, and still referring to FIG. 7, flight controller 704 may generate autonomous function as a function of an autonomous machine-learning model. As used in this disclosure an "autonomous machine-learning model" is a machine-learning model to produce an autonomous function output given flight element 724 and a pilot signal 736 as inputs; this is in contrast to a non-machine learning software program where the commands to be executed are determined in advance by a user and written in a programming language. As used in this disclosure a "pilot signal" is an element of datum representing one or more functions a pilot is controlling and/or adjusting. For example, pilot signal 736 may denote that a pilot is controlling and/or maneuvering ailerons, wherein the pilot is not in control of the rudders and/or propulsors. In an embodiment, pilot signal 736 may include an implicit signal and/or an explicit signal. For example, and without limitation, pilot signal 736 may include an explicit signal, wherein the pilot explicitly states there is a lack of control and/or desire for autonomous function. As a further non-limiting example, pilot signal 736 may include an explicit signal directing flight controller 704 to control and/or maintain a portion of aircraft, a portion of the flight plan, the entire aircraft, and/or the entire flight plan. As a further non-limiting example, pilot signal 736 may include an implicit signal, wherein flight controller 704 detects a lack of control such as by a malfunction, torque alteration, flight path deviation, and the like thereof. In an embodiment, and without limitation, pilot signal 736 may include one or more explicit signals to reduce torque, and/or one or more implicit signals that torque may be reduced due to reduction of airspeed velocity. In an embodiment, and without limitation, pilot signal 736 may include one or more local and/or global signals. For example, and without limitation, pilot signal 736 may include a local signal that is transmitted by a pilot and/or crew member. As a further non-limiting example, pilot signal 736 may include a global signal that is transmitted by air traffic control and/or one or more remote users that are in communication with the pilot of aircraft. In an embodiment, pilot signal 736 may be received as a function of a tri-state bus and/or multiplexor that denotes an explicit pilot signal should be transmitted prior to any implicit or global pilot signal.

Still referring to FIG. 7, autonomous machine-learning model may include one or more autonomous machine-learning processes such as supervised, unsupervised, or reinforcement machine-learning processes that flight controller 704 and/or a remote device may or may not use in the generation of autonomous function. As used in this disclosure "remote device" is an external device to flight controller 704. Additionally or alternatively, autonomous machine-learning model may include one or more autonomous machine-learning processes that a field-programmable gate array (FPGA) may or may not use in the generation of autonomous function. Autonomous machine-learning process may include, without limitation machine learning processes such as simple linear regression, multiple linear regression, polynomial regression, support vector regression, ridge regression, lasso regression, elasticnet regression, decision tree regression, random forest regression, logistic regression, logistic classification, K-nearest neighbors, support vector machines, kernel support vector machines, naïve bayes, decision tree classification, random forest classification, K-means clustering, hierarchical clustering, dimensionality reduction, principal component analysis, linear discriminant analysis, kernel principal component analysis, Q-learning, State Action Reward State Action (SARSA), Deep-Q network, Markov decision processes, Deep Deterministic Policy Gradient (DDPG), or the like thereof.

In an embodiment, and still referring to FIG. 7, autonomous machine learning model may be trained as a function of autonomous training data, wherein autonomous training data may correlate a flight element, pilot signal, and/or simulation data to an autonomous function. For example, and without limitation, a flight element of an airspeed velocity, a pilot signal of limited and/or no control of propulsors, and a simulation data of required airspeed velocity to reach the destination may result in an autonomous function that includes a semi-autonomous mode to increase thrust of the propulsors. Autonomous training data may be received as a function of user-entered valuations of flight elements, pilot signals, simulation data, and/or autonomous functions. Flight controller 704 may receive autonomous training data by receiving correlations of flight element, pilot signal, and/or simulation data to an autonomous function that were previously received and/or determined during a previous iteration of generation of autonomous function. Autonomous training data may be received by one or more remote devices and/or FPGAs that at least correlate a flight element, pilot signal, and/or simulation data to an autonomous function. Autonomous training data may be received in the form of one or more user-entered correlations of a flight element, pilot signal, and/or simulation data to an autonomous function.

Still referring to FIG. 7, flight controller 704 may receive autonomous machine-learning model from a remote device and/or FPGA that utilizes one or more autonomous machine learning processes, wherein a remote device and an FPGA is described above in detail. For example, and without limitation, a remote device may include a computing device, external device, processor, FPGA, microprocessor and the like thereof. Remote device and/or FPGA may perform the autonomous machine-learning process using autonomous training data to generate autonomous function and transmit the output to flight controller 704. Remote device and/or FPGA may transmit a signal, bit, datum, or parameter to flight controller 704 that at least relates to autonomous function. Additionally or alternatively, the remote device and/or FPGA may provide an updated machine-learning model. For example, and without limitation, an updated machine-learning model may be comprised of a firmware update, a software update, a autonomous machine-learning process correction, and the like thereof. As a non-limiting example a software update may incorporate a new simulation data that relates to a modified flight element. Additionally or alternatively, the updated machine learning model may be transmitted to the remote device and/or FPGA, wherein the remote device and/or FPGA may replace the autonomous machine-learning model with the updated machine-learning model and generate the autonomous function as a function of the flight element, pilot signal, and/or simulation data using the updated machine-learning model. The updated machine-learning model may be transmitted by the remote device and/or FPGA and received by flight controller 704 as a software update, firmware update, or corrected autonomous machine-learning model. For example, and without limitation autonomous machine learning model may utilize a neural net machine-learning process, wherein the updated machine-learning model may incorporate a gradient boosting machine-learning process.

Still referring to FIG. 7, flight controller 704 may include, be included in, and/or communicate with a mobile device such as a mobile telephone or smartphone. Further, flight controller may communicate with one or more additional devices as described below in further detail via a network interface device. The network interface device may be utilized for commutatively connecting a flight controller to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. The network may include any network topology and can may employ a wired and/or a wireless mode of communication.

In an embodiment, and still referring to FIG. 7, flight controller 704 may include, but is not limited to, for example, a cluster of flight controllers in a first location and a second flight controller or cluster of flight controllers in a second location. Flight controller 704 may include one or more flight controllers dedicated to data storage, security, distribution of traffic for load balancing, and the like. Flight controller 704 may be configured to distribute one or more computing tasks as described below across a plurality of flight controllers, which may operate in parallel, in series, redundantly, or in any other manner used for distribution of tasks or memory between computing devices. For example, and without limitation, flight controller 704 may implement a control algorithm to distribute and/or command the plurality of flight controllers. As used in this disclosure a "control algorithm" is a finite sequence of well-defined computer implementable instructions that may determine the flight component of the plurality of flight components to be adjusted. For example, and without limitation, control algorithm may include one or more algorithms that reduce and/or prevent aviation asymmetry. As a further non-limiting example, control algorithms may include one or more models generated as a function of a software including, but not limited to Simulink by MathWorks, Natick, Mass., USA. In an embodiment, and without limitation, control algorithm may be configured to generate an auto-code, wherein an "auto-code," is used herein, is a code and/or algorithm that is generated as a function of the one or more models and/or software's. In another embodiment, control algorithm may be configured to produce a segmented control algorithm. As used in this disclosure a "segmented control algorithm" is control algorithm that has been separated and/or parsed into discrete sections. For example, and without limitation, segmented control algorithm may parse control algorithm into two or more segments, wherein each segment of control algorithm may be performed by one or more flight controllers operating on distinct flight components.

In an embodiment, and still referring to FIG. 7, control algorithm may be configured to determine a segmentation boundary as a function of segmented control algorithm. As used in this disclosure a "segmentation boundary" is a limit and/or delineation associated with the segments of the segmented control algorithm. For example, and without limitation, segmentation boundary may denote that a segment in the control algorithm has a first starting section and/or a first ending section. As a further non-limiting example, segmentation boundary may include one or more boundaries associated with an ability of flight component 732. In an embodiment, control algorithm may be configured to create an optimized signal communication as a function of segmentation boundary. For example, and without limitation, optimized signal communication may include identifying the discrete timing required to transmit and/or receive the one or more segmentation boundaries. In an embodiment, and without limitation, creating optimized signal communication further comprises separating a plurality of signal codes across the plurality of flight controllers. For example, and without limitation the plurality of flight controllers may include one or more formal networks, wherein formal networks transmit data along an authority chain and/or are limited to task-related communications. As a further non-limiting example, communication network may include informal networks, wherein informal networks transmit data in any direction. In an embodiment, and without limitation, the plurality of flight controllers may include a chain path, wherein a "chain path," as used herein, is a linear communication path comprising a hierarchy that data may flow through. In an embodiment, and without limitation, the plurality of flight controllers may include an all-channel path, wherein an "all-channel path," as used herein, is a communication path that is not restricted to a particular direction. For example, and without limitation, data may be transmitted upward, downward, laterally, and the like thereof. In an embodiment, and without limitation, the plurality of flight controllers may include one or more neural networks that assign a weighted value to a transmitted datum. For example, and without limitation, a weighted value may be assigned as a function of one or more signals denoting that a flight component is malfunctioning and/or in a failure state.

Still referring to FIG. 7, the plurality of flight controllers may include a master bus controller. As used in this disclosure a "master bus controller" is one or more devices and/or components that are connected to a bus to initiate a direct memory access transaction, wherein a bus is one or more terminals in a bus architecture. Master bus controller may communicate using synchronous and/or asynchronous bus control protocols. In an embodiment, master bus controller may include flight controller 704. In another embodiment, master bus controller may include one or more universal asynchronous receiver-transmitters (UART). For example, and without limitation, master bus controller may include one or more bus architectures that allow a bus to initiate a direct memory access transaction from one or more buses in the bus architectures. As a further non-limiting example, master bus controller may include one or more peripheral devices and/or components to communicate with another peripheral device and/or component and/or the master bus controller. In an embodiment, master bus controller may be configured to perform bus arbitration. As used in this disclosure "bus arbitration" is method and/or scheme to prevent multiple buses from attempting to communicate with and/or connect to master bus controller. For example and without limitation, bus arbitration may include one or more schemes such as a small computer interface system, wherein a small computer interface system is a set of standards for physical connecting and transferring data between peripheral devices and master bus controller by defining commands, protocols, electrical, optical, and/or logical interfaces. In an embodiment, master bus controller may receive intermediate representation 712 and/or output language from logic component 720, wherein output language may include one or more analog-to-digital conversions, low bit rate transmissions, message encryptions, digital signals, binary signals, logic signals, analog signals, and the like thereof described above in detail.

Still referring to FIG. 7, master bus controller may communicate with a slave bus. As used in this disclosure a "slave bus" is one or more peripheral devices and/or components that initiate a bus transfer. For example, and without limitation, slave bus may receive one or more controls and/or asymmetric communications from master bus controller, wherein slave bus transfers data stored to master bus controller. In an embodiment, and without limitation, slave bus may include one or more internal buses, such as but not limited to a/an internal data bus, memory bus, system bus, front-side bus, and the like thereof. In another embodiment, and without limitation, slave bus may include one or more external buses such as external flight controllers, external computers, remote devices, printers, aircraft computer systems, flight control systems, and the like thereof.

In an embodiment, and still referring to FIG. 7, control algorithm may optimize signal communication as a function of determining one or more discrete timings. For example, and without limitation master bus controller may synchronize timing of the segmented control algorithm by injecting high priority timing signals on a bus of the master bus control. As used in this disclosure a "high priority timing signal" is information denoting that the information is important. For example, and without limitation, high priority timing signal may denote that a section of control algorithm is of high priority and should be analyzed and/or transmitted prior to any other sections being analyzed and/or transmitted. In an embodiment, high priority timing signal may include one or more priority packets. As used in this disclosure a "priority packet" is a formatted unit of data that is communicated between the plurality of flight controllers. For example, and without limitation, priority packet may denote that a section of control algorithm should be used and/or is of greater priority than other sections.

Still referring to FIG. 7, flight controller 704 may also be implemented using a "shared nothing" architecture in which data is cached at the worker, in an embodiment, this may enable scalability of aircraft and/or computing device. Flight controller 704 may include a distributer flight controller. As used in this disclosure a "distributer flight controller" is a component that adjusts and/or controls a plurality of flight components as a function of a plurality of flight controllers. For example, distributer flight controller may include a flight controller that communicates with a plurality of additional flight controllers and/or clusters of flight controllers. In an embodiment, distributed flight control may include one or more neural networks. For example, neural network also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 7, a node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above. In an embodiment, and without limitation, a neural network may receive semantic units as inputs and output vectors representing such semantic units according to weights $w_i$ that are derived using machine-learning processes as described in this disclosure.

Still referring to FIG. 7, flight controller may include a sub-controller 740. As used in this disclosure a "sub-controller" is a controller and/or component that is part of a distributed controller as described above; for instance, flight controller 704 may be and/or include a distributed flight controller made up of one or more sub-controllers. For example, and without limitation, sub-controller 740 may include any controllers and/or components thereof that are similar to distributed flight controller and/or flight controller as described above. Sub-controller 740 may include any component of any flight controller as described above. Sub-controller 740 may be implemented in any manner suitable for implementation of a flight controller as described above. As a further non-limiting example, sub-controller 740 may include one or more processors, logic components and/or computing devices capable of receiving, processing, and/or transmitting data across the distributed flight controller as described above. As a further non-limiting example, sub-controller 740 may include a controller that receives a signal from a first flight controller and/or first distributed flight controller component and transmits the signal to a plurality of additional sub-controllers and/or flight components.

Still referring to FIG. 7, flight controller may include a co-controller 744. As used in this disclosure a "co-controller" is a controller and/or component that joins flight controller 704 as components and/or nodes of a distributer flight controller as described above. For example, and without limitation, co-controller 744 may include one or more controllers and/or components that are similar to flight controller 704. As a further non-limiting example, co-controller 744 may include any controller and/or component that joins flight controller 704 to distributer flight controller. As a further non-limiting example, co-controller 744 may include one or more processors, logic components and/or computing devices capable of receiving, processing, and/or transmitting data to and/or from flight controller 704 to distributed flight control system. Co-controller 744 may include any component of any flight controller as described above. Co-controller 744 may be implemented in any manner suitable for implementation of a flight controller as described above.

In an embodiment, and with continued reference to FIG. 7, flight controller 704 may be designed and/or configured to perform any method, method step, or sequence of method steps in any embodiment described in this disclosure, in any order and with any degree of repetition. For instance, flight controller 704 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 8:
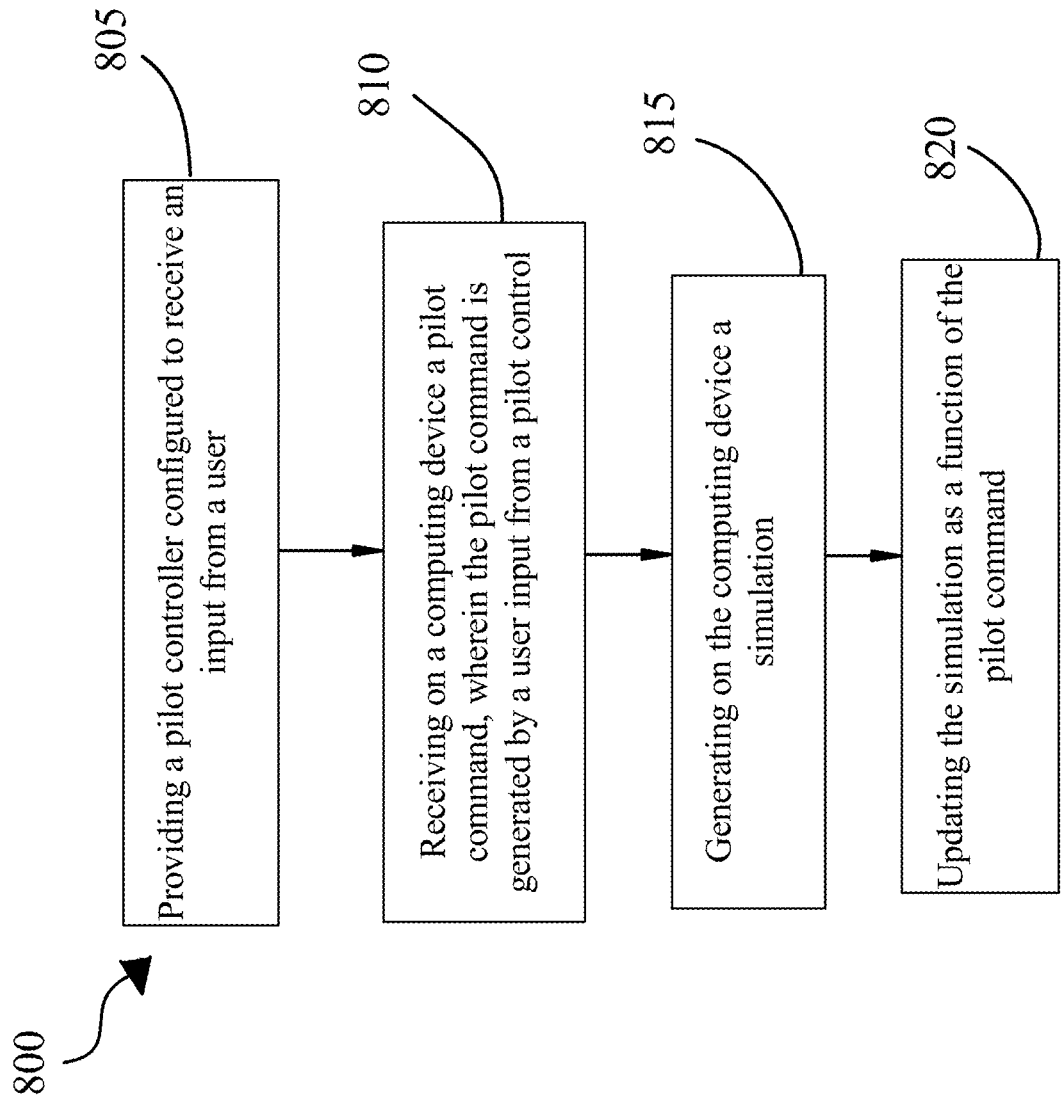
FIG. 8 is a block diagram of a method for simulating a flight of an electric aircraft.

Now referring to FIG. 8, a flowchart for a method 800 for simulating a flight of an electric aircraft is presented. At step 805, a pilot controller configured to receive an input from a user is provided. The pilot controller may include a plurality of control devices. In some embodiments, the pilot controller may include a display with a GUI. In some embodiments, the pilot controller may include a throttle, control wheel, pedals, levers, and/or other devices used to control an electric aircraft. In some embodiments, the pilot controller may include a virtual reality headset.

At step 810, a pilot command is received on a computing device. The pilot command is generated by a user input from a pilot control. The pilot command may include data about a desired applied torque to a flight component of an electric aircraft based on the user input from a pilot control. In some embodiments, the pilot command may include data about power routing to power systems. In some embodiments, the pilot command may include data about a roll, yaw, and/or pitch of an electric aircraft.

At step 815, a simulation is generated on the computing device. The simulation may include an electric aircraft model. The electric aircraft model may include an eVTOL aircraft. In some embodiments, the simulation may include a plurality of parameters. The parameters may include an environment and a weather condition. In some embodiments, the parameters may include a health status of an electric aircraft. In some embodiments, the parameters may include a health status of a battery of an electric aircraft. The parameters may include a set of parameters configured to simulate a real flight of an electric aircraft. In some embodiments, the parameters may include a propulsion system and aerodynamic values of an electric aircraft. In some embodiments, the parameters may include flight scenarios for training a pilot.

At step 820, the simulation is updated as a function of the pilot command. The simulation may be configured to update a trajectory of an electric aircraft model based on the pilot command. The simulation may be configured to update a movement of one or more flight components of an electric aircraft based on the pilot command. In some embodiments, the simulation may be configured to provide feedback to a user. The feedback may include feedback on flight course deviation, battery health and charge status, electric aircraft health status, and electric aircraft speed. In some embodiments, the feedback may provide feedback found in a primary flight display.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 9:
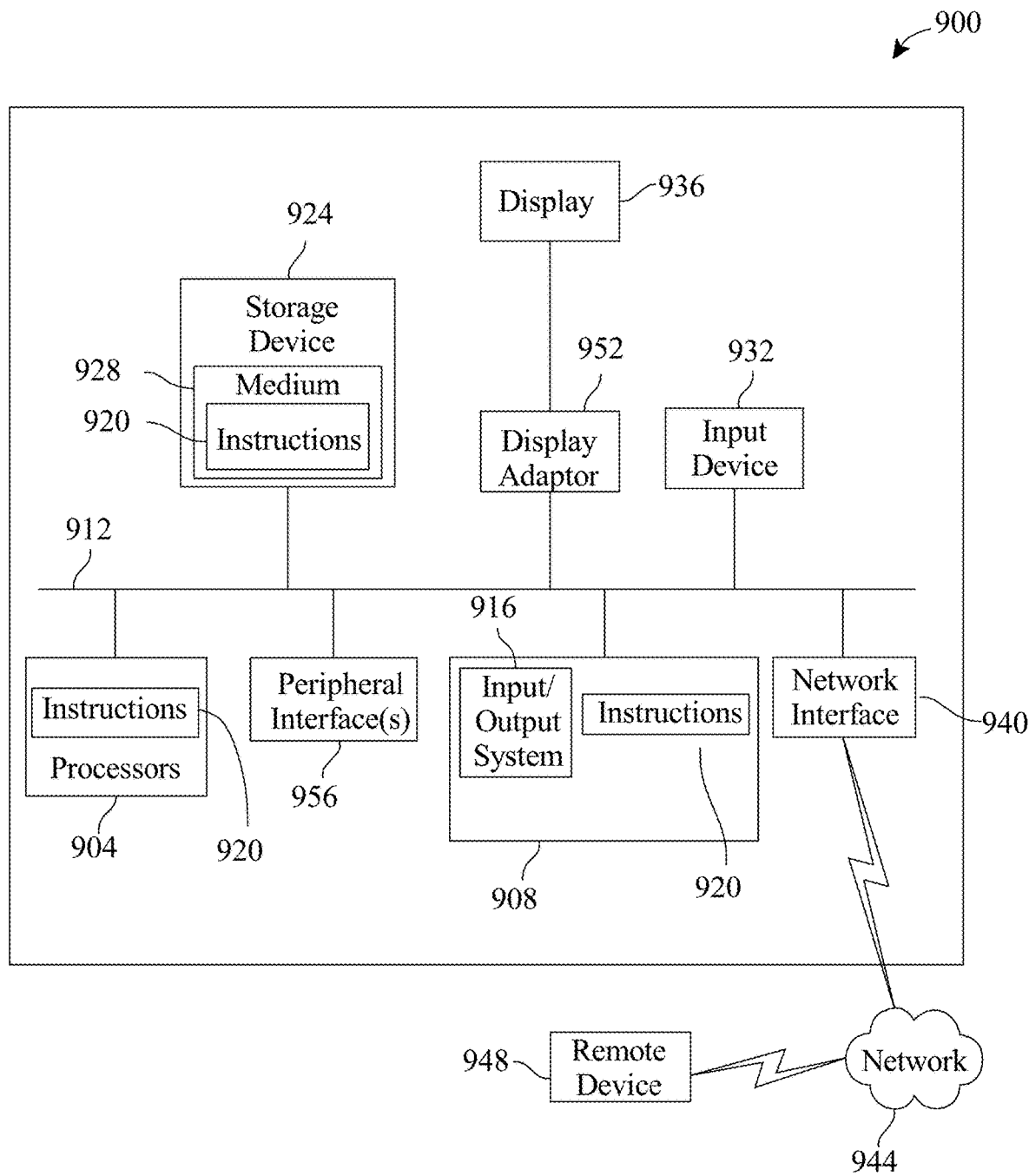
FIG. 9 is a block diagram of a computing system that can be used to implement any one or more of the methodologies disclosed herein and any one or more portions thereof.

FIG. 9 shows a diagrammatic representation of one embodiment of a computing device in the exemplary form of a computer system 900 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 900 includes a processor 904 and a memory 908 that communicate with each other, and with other components, via a bus 912. Bus 912 may include any of several types of bus structures including, but not limited to, a memory bus, a memory controller, a peripheral bus, a local bus, and any combinations thereof, using any of a variety of bus architectures.

Processor 904 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 904 may be organized according to Von Neumann and/or Harvard architecture as a non-limiting example. Processor 904 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 908 may include various components (e.g., machine-readable media) including, but not limited to, a random-access memory component, a read only component, and any combinations thereof. In one example, a basic input/output system 916 (BIOS), including basic routines that help to transfer information between elements within computer system 900, such as during start-up, may be stored in memory 908. Memory 908 may also include (e.g., stored on one or more machine-readable media) instructions (e.g., software) 920 embodying any one or more of the aspects and/or methodologies of the present disclosure. In another example, memory 908 may further include any number of program modules including, but not limited to, an operating system, one or more application programs, other program modules, program data, and any combinations thereof.

Computer system 900 may also include a storage device 924. Examples of a storage device (e.g., storage device 924) include, but are not limited to, a hard disk drive, a magnetic disk drive, an optical disc drive in combination with an optical medium, a solid-state memory device, and any combinations thereof. Storage device 924 may be connected to bus 912 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 924 (or one or more components thereof) may be removably interfaced with computer system 900 (e.g., via an external port connector (not shown)). Particularly, storage device 924 and an associated machine-readable medium 928 may provide nonvolatile and/or volatile storage of machine-readable instructions, data structures, program modules, and/or other data for computer system 900. In one example, software 920 may reside, completely or partially, within machine-readable medium 928. In another example, software 920 may reside, completely or partially, within processor 904.

Computer system 900 may also include an input device 932. In one example, a user of computer system 900 may enter commands and/or other information into computer system 900 via input device 932. Examples of an input device 932 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 932 may be interfaced to bus 912 via any of a variety of interfaces (not shown) including, but not limited to, a serial interface, a parallel interface, a game port, a USB interface, a FIREWIRE interface, a direct interface to bus 912, and any combinations thereof. Input device 932 may include a touch screen interface that may be a part of or separate from display 936, discussed further below. Input device 932 may be utilized as a user selection device for selecting one or more graphical representations in a graphical interface as described above.

A user may also input commands and/or other information to computer system 900 via storage device 924 (e.g., a removable disk drive, a flash drive, etc.) and/or network interface device 940. A network interface device, such as network interface device 940, may be utilized for connecting computer system 900 to one or more of a variety of networks, such as network 944, and one or more remote devices 948 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 944, may employ a wired and/or a wireless mode of communication. In general, any network topology may be used. Information (e.g., data, software 920, etc.) may be communicated to and/or from computer system 900 via network interface device 940.

Computer system 900 may further include a video display adapter 952 for communicating a displayable image to a display device, such as display device 936. Examples of a display device include, but are not limited to, a liquid crystal display (LCD), a cathode ray tube (CRT), a plasma display, a light emitting diode (LED) display, and any combinations thereof. Display adapter 952 and display device 936 may be utilized in combination with processor 904 to provide graphical representations of aspects of the present disclosure. In addition to a display device, computer system 900 may include one or more other peripheral output devices including, but not limited to, an audio speaker, a printer, and any combinations thereof. Such peripheral output devices may be connected to bus 912 via a peripheral interface 956. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A system for flight simulation of an electric aircraft, the system including:
    a pilot control, wherein the pilot control is configured to receive an input from a user;
    a pilot command, wherein the pilot command is generated by the input;
    a flight controller configured to generate an autonomous function as a function of an autonomous machine-learning model, the autonomous machine-learning model configured to receive a flight element and a pilot signal as inputs and outputs an autonomous function for the aircraft, wherein the autonomous machine-learning model is trained as a function of autonomous training data and the autonomous training data correlates at least the flight element, the pilot signal, and simulation data to the autonomous function; and
    a computing device, wherein the computing device is configured to generate a simulation,
    the simulation including an electric aircraft model and the autonomous machine learning-model, the electric aircraft model configured to:
        simulate a performance of an electric aircraft, wherein the performance is determined by at least the pilot command and the autonomous function; and
        provide feedback to the user based on the performance of the electric aircraft; and
    wherein the simulation is configured to update the electric aircraft model as a function of the pilot command.

2. The system of claim 1, wherein the electric aircraft model includes an eVTOL model.

3. The system of claim 1, wherein the pilot control includes a control device.

4. The system of claim 1, wherein the pilot control includes a brake device.

5. The system of claim 1, wherein the pilot control includes a throttle device.

6. The system of claim 1, wherein the pilot command is configured to identify a torque of a flight component of the electric aircraft model as a function of the input of the user.

7. The system of claim 1, wherein the simulation is configured to include a battery performance of the electric aircraft model.

8. The system of claim 7, wherein the battery performance includes thermal performance of a battery of the electric aircraft model.

9. The system of claim 7, wherein the battery performance includes a charge state.

10. The system of claim 7, wherein the battery performance includes a health state.

11. A method for simulating a flight of an electric aircraft, the method including:

providing a pilot controller configured to receive an input from a user;

receiving, on a computing device, a pilot command, wherein the pilot command is generated by a user input from a pilot control;

generating, by a flight controller in communication with the computing device, an autonomous function as a function of an autonomous machine-learning model, the autonomous machine-learning model configured to receive a flight element and a pilot signal as inputs and outputs an autonomous function for the aircraft, wherein the autonomous machine-learning model is trained as a function of autonomous training data and the autonomous training data correlates at least the flight element, the pilot signal, and simulation data to the autonomous function;

generating, on the computing device, a simulation, wherein the simulation is configured to include:

an electric aircraft model, the electric aircraft model configured to:

simulate a performance of an electric aircraft, wherein the performance is determined by at least the pilot command and the autonomous function; and provide feedback to the user based on the performance of the electric aircraft;

the autonomous machine learning-model;

a performance metric of the electric aircraft model; and updating the simulation as a function of the pilot command.

12. The method of claim 11, wherein the electric aircraft model includes an eVTOL.

13. The method of claim 11, wherein the pilot controller includes a control device.

14. The method of claim 11, wherein the pilot controller includes a brake device.

15. The method of claim 11, wherein the pilot controller includes a throttle device.

16. The method of claim 11, wherein the performance metric of the electric aircraft model includes a battery performance of the electric aircraft model.

17. The method of claim 16, wherein the battery performance includes thermal performance.

18. The method of claim 16, wherein the battery performance includes a charge state.

19. The method of claim 11, wherein the simulation is further configured to include a graphical user interface (GUI).

20. The method of claim 11, wherein the pilot command is configured to identify a torque applied to a flight component of the electric aircraft model based on the user input of the pilot control.

* * * * *